(12) United States Patent
Hasegawa et al.

(10) Patent No.: US 7,125,651 B2
(45) Date of Patent: Oct. 24, 2006

(54) METHOD OF MANUFACTURING SEMICONDUCTOR INTEGRATED CIRCUIT DEVICE OPTICAL MASK THEREFOR, ITS MANUFACTURING METHOD, AND MASK BLANKS

(75) Inventors: Norio Hasegawa, Nishitama (JP); Tsuneo Terasawa, Ome (JP); Toshihiko Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 171 days.

(21) Appl. No.: 10/674,381

(22) Filed: Oct. 1, 2003

(65) Prior Publication Data

US 2004/0063037 A1   Apr. 1, 2004

Related U.S. Application Data

(63) Continuation of application No. 09/646,036, filed as application No. PCT/JP00/04339 on Jun. 30, 2000, now Pat. No. 6,677,107.

(30) Foreign Application Priority Data

Jun. 30, 1999   (JP) ................................. 11-185221

(51) Int. Cl.
G03C 5/00 (2006.01)
G03F 9/00 (2006.01)
(52) U.S. Cl. ............................. 430/311; 430/5; 430/396
(58) Field of Classification Search .................... 430/5, 430/322, 323, 324, 30, 22, 394, 396, 311; 378/34, 35
See application file for complete search history.

(56) References Cited

U.S. PATENT DOCUMENTS

| | | | |
|---|---|---|---|
| 3,942,981 A | 3/1976 | Sato | |
| 4,242,438 A | 12/1980 | Sato | |
| 4,405,701 A | 9/1983 | Banks et al. | |
| 4,684,971 A | 8/1987 | Payne | |
| 5,250,983 A | 10/1993 | Yamamura | |
| 5,262,257 A | 11/1993 | Fukuda et al. | |
| 5,324,600 A | 6/1994 | Jinbo et al. | |
| 5,366,913 A | 11/1994 | Nakao | |
| 5,376,483 A | 12/1994 | Rolfson | |
| 5,378,585 A | 1/1995 | Watanabe | |
| 5,389,474 A | 2/1995 | Iguchi et al. | |
| 5,418,092 A | 5/1995 | Okamoto | |
| 5,419,972 A | 5/1995 | Kawaguchi et al. | |
| 5,552,250 A | 9/1996 | Nozue | |
| 5,556,724 A | 9/1996 | Tarumoto et al. | |
| 5,629,113 A | 5/1997 | Watanabe | |
| 5,637,425 A | 6/1997 | Lee et al. | |
| 5,725,973 A | 3/1998 | Han et al. | |
| 5,741,613 A | 4/1998 | Moon et al. | |
| 5,881,125 A | 3/1999 | Dao | |
| 5,948,572 A | 9/1999 | Liu et al. | |
| 5,989,760 A | 11/1999 | Mangat et al. | |
| 6,165,650 A | 12/2000 | Williams | |
| 6,192,100 B1 | 2/2001 | Acosta et al. | |
| 6,677,107 B1 * | 1/2004 | Hasegawa et al. | 430/311 |

FOREIGN PATENT DOCUMENTS

| | | |
|---|---|---|
| JP | 53-106574 | 9/1978 |
| JP | 56-30129 | 3/1981 |
| JP | 5922050 | 2/1984 |
| JP | 62-31855 | 2/1987 |
| JP | 63-71853 | 4/1988 |
| JP | 63-80258 | 4/1988 |
| JP | 63-303356 | 12/1988 |
| JP | 1-102567 | 4/1989 |
| JP | 2-1850 | 1/1990 |
| JP | 2-47655 | 2/1990 |
| JP | 2-96159 | 4/1990 |
| JP | 2-247647 | 10/1990 |
| JP | 3-45950 | 2/1991 |
| JP | 3-214160 | 9/1991 |
| JP | 3-274551 | 12/1991 |
| JP | 4-58245 | 2/1992 |
| JP | 4-33043 | 3/1992 |
| JP | 4-136854 | 5/1992 |
| JP | 4-269749 | 9/1992 |
| JP | 5-142757 | 6/1993 |
| JP | 5-181257 | 7/1993 |
| JP | 5-210231 | 8/1993 |
| JP | 5-232674 | 9/1993 |
| JP | 5-232675 | 9/1993 |
| JP | 5-289307 | 11/1993 |
| JP | 5-297564 | 11/1993 |
| JP | 6-19107 | 1/1994 |
| JP | 6-83025 | 3/1994 |
| JP | 6-347994 | 12/1994 |

(Continued)

Primary Examiner—Christopher G. Young
(74) Attorney, Agent, or Firm—Antonelli, Terry, Stout and Kraus, LLP.

(57) ABSTRACT

In order to suppress or prevent the occurrence of foreign matter in the manufacture of a semiconductor integrated circuit device by the use of a photo mask constituted in such a manner that a resist film is made to function as a light screening film, inspection or exposure treatment is carried out, when the photo mask 1PA1 has been mounted on a predetermined apparatus such as, e.g., an inspection equipment or aligner, in the state in which a mounting portion 2 of the predetermined apparatus is contacted with that region of a major surface of a mask substrate 1a of the photo mask 1PA1 in which a light shielding pattern 1b and a mask pattern 1mr, each formed of a resist film, on the major surface of the mask substrate 1a do not exist.

38 Claims, 17 Drawing Sheets

FOREIGN PATENT DOCUMENTS

| | | |
|---|---|---|
| JP | 7-219203 | 8/1995 |
| JP | 7-325383 | 12/1995 |
| JP | 9-15830 | 1/1997 |
| JP | 9-36016 | 2/1997 |
| JP | 9-43831 | 2/1997 |
| JP | 9-80741 | 3/1997 |
| JP | 62-85254 | 4/1997 |
| JP | 9-211837 | 8/1997 |
| JP | 10-69054 | 3/1998 |
| JP | 11-15131 | 1/1999 |
| JP | 11-133588 | 5/1999 |
| JP | 11-143053 | 5/1999 |

\* cited by examiner

METHOD OF MANUFACTURING SEMICONDUCTOR INTEGRATED CIRCUIT DEVICE OPTICAL MASK THEREFOR, ITS MANUFACTURING METHOD, AND MASK BLANKS

This application is a Continuation application of application Ser. No. 09/646,036, filed Sep. 13, 2000 now U.S. Pat. No. 6,677,107, the contents of which are incorporated herein by reference in their entirety. Application Ser. No. 09/646,036 is a National Stage application, filed under 35 USC § 371, of International (PCT) Application No. PCT/JP00/04339, filed Jun. 30, 2000.

BACKGROUND OF THE INVENTION

The present invention relates to a method of manufacturing a semiconductor integrated circuit device, an optical mask therefor, its manufacturing method, and mask blanks; and, more particularly, the invention relates to a technique which can be effectively applied to the exposure technique used in the process of manufacturing a semiconductor integrated circuit device.

In the manufacture of a semiconductor integrated circuit device, a lithography technique is used as a method of transferring micro patterns onto semiconductor wafers. In the lithography technique, a projection exposure system is mainly used; wherein, the pattern of a photo mask provided on the projection aligner is transferred onto a semiconductor wafer to thereby form a device pattern.

The ordinary photo mask examined by the present inventor is made by processing a light screening material such as chrominum (Cr) or the like formed on a transparent quartz substrate. In other words, the photo mask is constituted in such a manner that a light screening film comprised of chromium or the like is formed in a desired shape on the quartz substrate. The processing of the light screening film is carried out, for example, in the following manner. After an electron-beam-sensitive resist is applied onto the light screening film, a desired pattern is written on the electron-beam-sensitive resist by an electron beam lithography system. Subsequently, after the resistor pattern of a desired shape is formed by development the light screening film is processed by dry etching or wet etching by the use of the thus obtained resist pattern as a mask. After this, the resist is removed, cleaning or the like is carried out, and thus, a light shielding pattern of a desired shape is formed on the transparent quartz substrate.

Further, recently, various mask structures have been proposed for the purpose of enhancing the resolution of the lithography. For example, in Japanese Patent Laid-Open No. 136854/1992, there is disclosed a mask structure constituted in such a manner that, as a means for enhancing the resolution of a single transparent pattern, the portion surrounding the single transparent pattern is made semitransparent, in other words, the light screening portion of the photo mask is made semitransparent; and, thus, the phase of the slight amount of light passing through this semitransparent portion and the phase of the light passing through the transparent pattern are inverted with respect to each other. In other words, light that is below the sensitivity of the photo resist for transferring the pattern is allowed to pass through the semitransparent film, and the phase of this light and the phase of the light which has passed through the transparent pattern are inverted with respect to each other. The light which has passed through the semitransparent film is inverted in phase with respect to the light which has passed through the transparent pattern, which is the major pattern, so that its phase is inverted in the boundary portion of the patterns, and thus, the light intensity in the boundary portion approaches 0. As a result, the ratio between the intensity of the light which has passed the transparent pattern and the intensity of the light in the pattern boundary portion becomes large; and thus, a light intensity distribution with a contrast higher than in the case of the techniques using no semitransparent film is obtained. This is called a halftone type phase shift mask. In the manufacturing process of the halftone type phase shift mask, the light screening film of the above-mentioned ordinary photo mask is altered to a halftone phase shift film, so that the halftone type phase shift mask is manufactured by approximately the same process as the above-mentioned ordinary photo mask manufacturing process.

Further, for example in Japanese Patent Laid-Open No. 289307/1993, there is disclosed a method of forming a light screening film by the use of a resist film for the purpose of simplifying the photo mask manufacturing process and enhancing the precision. This method utilizes the properties of an ordinary electron-beam-sensitive or an ordinary light-sensitive resist that screens the vacuum ultraviolet rays with a wavelength below about 200 nm. According to this method, the step of etching the light screening film and the step of removing the resist are disused; and thus, the reduction in cost of the photo masks, the enhancement in dimensional accuracy thereof, and the reduction of defects thereof become possible.

Further, in Japanese Patent Laid-Open No. 181257/1993 for example, there is disclosed a so-called halftone mask constituted in such a manner that, on a substrate which is transparent with respect to the exposure light, a phase shift film comprising a semitransparent material which absorbs the exposure light is provided. In case of the technique disclosed in this Japanese Patent Laid-Open No. 181257/1993, the mask vacuum-holding surface is the mask substrate surface, so that exposure is executed with the mask surface directed to the exposure light source. In this case, the mechanical strength of the phase shift film comprising a semi-transparent material is high even at the periphery of the mask, and there is no problem with respect to mask absorption and the like. Further, as for the mask alignment, the mask has light screening properties, and thus, there seems to be no problem.

Further, in Japanese Patent Laid-Open No. 15830/1997 for example, there is disclosed a technique according to which, after a light shielding pattern is formed on a mask substrate, a phase shift film is formed to a film thickness greater than the film thickness corresponding to the target phase difference, and a desired portion provided with the phase difference is etched by an amount corresponding to the target phase difference.

However, in case of the above-mentioned technique, according to which the light shielding pattern on the photo mask is formed by a resist film, there are not disclosed the problematic point encountered when the photo mask is actually used in the process of manufacturing a semiconductor integrated device, the problematic point encountered in the actual photo mask manufacture, and the measures to counter these problematic points; and, the present inventor has found that the above-mentioned technique has the following problems.

More specifically, it is difficult to detect predetermined patterns, such as, e.g., an alignment mark, a pattern measuring mark or a product decision mark on the photo mask, which are used for the detection of various kinds of information. For example, in the case of a photo mask defect inspection system, an aligner and the like, which are used at present, a halogen lamp or the like is mainly used for the alignment of the photo mask. Accordingly, in case the photo mask is mounted on a defect inspection system or an aligner, if the detection mark on the photo mask is formed by a resist film pattern, then no high contrast can be obtained, since the resist mask is high in light transmissivity; and thus, the detection of the pattern is difficult. Due to this, it becomes difficult to align the photo mask with the defect inspection system or the aligner, and thus, there arises the problem that no good inspection or exposure can be made.

Further, when the photo mask is mounted onto the defect inspection system or the aligner, foreign matter is produced. In the case of the above-mentioned technique, when the photo mask is mounted onto the defect inspection system or the aligner, the resist film of the photo mask comes into direct contact with a photo mask fixing member (such as, e.g., a vacuum fixing member) of the defect inspection system or the aligner, so that, upon the breakage or peeling-off of the resist film, foreign matter is produced. This foreign matter tends to attach to the surface of, for example, the lens of the inspection system or the aligner, to contaminate the inside of the chamber or to attach to the surface of the semiconductor wafer, as a result of which, a deterioration of the inspection accuracy or the transfer accuracy of the pattern is brought about, and defects, such as short-circuit or open-circuit defects of the pattern are caused. Thus, the reliability and manufacturing yield of the semiconductor integrated circuit devices fall, this being another problem.

SUMMARY OF THE INVENTION

Thus, it is an object of the present invention to provide a method of manufacturing a semiconductor integrated circuit device using a photo mask constituted in such a manner that a resist film is made to function as a light screening film, wherein the information detecting ability of the above-mentioned photo mask can be enhanced.

Further, another object of the invention is to provide a method of manufacturing a semiconductor integrated circuit device using a photo mask constituted in such a manner that the resist mask is made to function as a light screening film, wherein the accuracy in the alignment of the photo mask with the inspection equipment or the exposure device can be enhanced.

Still another object of the invention is to provide a method of manufacturing a semiconductor integrated circuit device using a photo mask constituted in such a manner that a resist film is made to function as a light screening film, wherein the inspection accuracy of the photo mask inspection equipment can be enhanced.

Still another object of the invention is to provide a method of manufacturing a semiconductor integrated circuit device using a photo mask constituted in such a manner that a resist mask is made to function as a light screening film, wherein the accuracy in the pattern transfer of the aligner can be enhanced.

Further, still another object of the invention is to provide a semiconductor integrated circuit device using a photo mask constituted in such a manner that a resist film is made to function as a light screening film, wherein the occurrence of foreign matter can be suppressed or prevented.

Further, still another object of the invention is to provide a semiconductor integrated circuit device using a photo mask constituted in such a manner that a resist film is made to function as a light screening film, wherein the reliability and manufacturing yield of semiconductor integrated circuit devices can be enhanced.

The above-mentioned and other objects and novel features of the present invention will be apparent from the description in the specification and the accompanying drawings.

Outlines of the representative aspects of the inventive features disclosed in the present application will be briefly described below.

According to the present invention, when an optical mask is mounted on a predetermined apparatus, such as a inspection equipment or an aligner, a light shielding pattern comprising a resist film on the mask substrate of the optical mask is disposed on the major surface of the mask substrate in such a manner that the light shielding pattern and the fitting portion of the predetermined apparatus is not contacted.

Further, according to the invention, when the optical mask is mounted onto the predetermined apparatus, a predetermined treatment is carried out on the major surface of the mask substrate of the optical mask in the state in which the fitting portion of the predetermined apparatus is contacted with a region in which the light shielding pattern comprising the resist film does not exist.

Further, according to the invention, a light shielding pattern comprising a resist film is disposed in an integrated circuit pattern region of a first mask substrate; in the outer periphery of the above-mentioned integrated circuit pattern region, a light screening metal region made of a metal is disposed; and an opening is provided in the light screening metal region, and a optical mask is used which is constituted in such a manner that a mask pattern for detecting the information of the optical mask is formed.

Further, according to the invention, a light shielding pattern comprising a resist film is disposed in an integrated circuit pattern region of a first major surface of a mask substrate; in the outer periphery of the integrated circuit pattern region, a light screening metal region comprising a metal is disposed; and further, when an optical mask is mounted onto an aligner, with the optical mask being constituted in such a manner that an opening is provided in the light screening metal region, and a mark pattern for detecting the information of the optical mask is formed, exposure light is irradiated from a second major surface side of the mask substrate, in the state in which the fitting portion of the aligner is in contact with a region in which the light shielding pattern comprising a resist film does not exist; and exposure light which has transmitted through the optical mask is projected by reduction exposure onto the semiconductor wafer, whereby the integrated circuit pattern is transferred onto the semiconductor wafer.

Further, according to the invention, a light shielding pattern comprising a resist film is disposed on an integrated circuit pattern region of a first major surface of a mask substrate; in the outer periphery of the integrated circuit pattern region, a light screening metal region made of a metal is disposed; an opening is provided in the light screening metal region, and a mark pattern is provided for detecting the information of the optical mask; and further, there is used an optical mask constituted in such a manner that a pellicle, which is fixed in a state in which the base portion of the pellicle is contacted with the light screening metal region or the mask substrate, is disposed on the first major surface side of the mask.

Further, according to the invention, when the optical mask is mounted on a predetermined apparatus, a predetermined treatment is carried out, on the major surface of the mask substrate of the optical mask, in a state in which the fitting portion of the predetermined apparatus is in contact with a region in which a halftone pattern comprising a resist film does not exist.

Further, according to the invention, a light shielding pattern comprising a resist film is disposed in an integrated circuit pattern region on a first major surface of the mask substrate; in the outer periphery of the integrated circuit pattern region, a light screening metal region comprising a metal is disposed; an opening is provided in the light screening metal region, and a mark pattern is provided for detecting the information of the optical mask; and further, on the first major surface of the mask substrate, there is provided a phase shift film for causing the exposure light which has transmitted through the optical mask to produce a phase difference.

Further, outlines of other aspects of the inventive features disclosed in the present application will be briefly described below.

1. A method of manufacturing a semiconductor integrated circuit device, comprising:
   (a) the step of irradiating far ultraviolet or vacuum ultraviolet exposure light from a second major surface side of a mask substrate, the mask substrate having on a first major surface thereof a light shielding pattern which is an integrated circuit pattern on a mask and comprises a photo resist pattern; and
   (b) the step of reduction-projecting, by a projection optical system, said exposure light which has transmitted through said mask substrate, whereby the integrated circuit pattern is imaged on a photo resist film formed on a first major surface of a semiconductor integrated circuit wafer and thus transferred.

2. The method of manufacturing a semiconductor integrated circuit device according to Claim 1, wherein the wavelength of the exposure light is at least 100 nm less than 250 nm.

3. The method of manufacturing a semiconductor integrated circuit device according to Claim 2, wherein the wavelength of said exposure light is at least 100 nm but less than 200 nm.

4. The method of manufacturing a semiconductor integrated circuit device according to Claim 3, wherein, in the peripheral portion of the first major surface of the mask substrate, a light screening metal region is provided.

5. The method of manufacturing a semiconductor integrated circuit device according to Claim 4, wherein, on the first major surface of said mask substrate, a pellicle is provided so as to cover said integrated circuit pattern, said pellicle being contact-fixed on said light screening metal region.

6. A method of manufacturing a semiconductor integrated circuit device, comprising:
   (a) the step of irradiating far ultraviolet or vacuum ultraviolet exposure light from a first major surface or a second major surface side of the mask substrate in the state in which the peripheral region of the mask substrate is held on a mask holding mechanism, the mask substrate having on the first major surface thereof a light shielding pattern which is an integrated circuit pattern on a mask and comprises a photo resist pattern, the resist pattern being not provided on the peripheral region; and
   (b) the step of reduction-projecting, by a projection optical system, the exposure light which has transmitted through said mask substrate, whereby the integrated circuit pattern is imaged on a photo resist film formed on a first major surface of a semiconductor integrated circuit wafer and thus transferred.

7. The method of manufacturing a semiconductor integrated circuit according to Claim 6, wherein the wavelength of the exposure light is at least 100 nm but less than 250 nm.

8. The method of manufacturing a semiconductor integrated circuit according to Claim 7, wherein, wherein the wavelength of the exposure light is at least 100 nm but less than 200 nm.

9. The method of manufacturing a semiconductor integrated circuit device according to Claim 8, wherein, in the peripheral portion of the first major surface of the mask substrate, a light screening metal region is provided.

10. The method of manufacturing a semiconductor integrated circuit device according to Claim 9, wherein, on the first major surface of the mask substrate, a pellicle is provided so as to cover said integrated circuit pattern, said pellicle being contact-fixed on said light screening metal region.

11. A method of manufacturing a semiconductor integrated circuit device, comprising:
    (a) the step of irradiating far ultraviolet or vacuum ultraviolet exposure light from a first major surface or second major surface side of a mask substrate, the mask substrate having, in an integrated circuit pattern region of the first major surface thereof, a light shielding pattern which is an integrated circuit pattern on a mask and comprises a photo resist pattern and having a light screening metal nregion provided in the peripheral region of the first major surface; and
    (b) the step of reduction-projecting, by a projection optical system, said exposure light which has transmitted through the mask substrate, whereby, on a photo resist film formed on a first major surface of a semiconductor integrated circuit wafer, the integrated circuit pattern is imaged and thus transferred.

12. The method of manufacturing a semiconductor integrated circuit device according to Claim 11, wherein the wavelength of the exposure light is at least 100 nm but less than 250 nm.

13. The method of manufacturing a semiconductor integrated circuit device according to Claim 12, wherein the wavelength of the exposure light is at least 100 nm but less than 200 nm.

14. The method of manufacturing a semiconductor integrated circuit device according to Claim 13, wherein, on the first major surface of the mask substrate, a pellicle is provided so as to cover the integrated circuit pattern, the pellicle being contact-fixed on the light screening metal region.

15. A method of manufacturing a semiconductor integrated circuit device, comprising:
    (a) the step of irradiating far ultraviolet or vacuum ultraviolet exposure light from a first major surface or a second major surface side of a mask substrate, the mask substrate having, in an integrated circuit pattern region of the first major surface thereof, a light shielding pattern which is an integrated circuit pattern on a mask and comprises a photo resist pattern, wherein a pellicle is contact-fixed in that part of the peripheral portion of the integrated circuit pattern region in which the photo resist pattern is not formed so as cover said integrated circuit pattern; and
    (b) the step of reduction-projecting, by a projection optical system, said exposure light which has transmitted through the mask substrate, whereby, on a photo resist film formed on a first major surface of a semiconductor integrated circuit wafer, the integrated circuit pattern is imaged and thus transferred.

16. The method of manufacturing a semiconductor integrated circuit device according to Claim 15, wherein the wavelength of the exposure light is at least 100 nm but less than 250 nm.

17. The method of manufacturing a semiconductor integrated circuit device according to Claim 16, wherein the wavelength of the exposure light is at least 100 nm but less than 200 nm.

18. The method of manufacturing a semiconductor integrated circuit device according to Claim 17, wherein, in the peripheral portion of the first major surface of the mask substrate, a light screening metal region is provided.

19. The method of manufacturing a semiconductor integrated circuit device according to Claim 18, wherein, on the first major surface of said mask substrate, the pellicle is contact-fixed on said light screening metal region.

20. A method of manufacturing a semiconductor integrated circuit device, comprising:

(a) the step of irradiating far ultraviolet or vacuum ultraviolet exposure light from a first major surface side or a second major surface side of a mask substrate, the mask substrate having, on the first major surface thereof, a halftone light shielding pattern comprising a photo resist pattern which constitutes an integrated circuit pattern on a mask; and (b) the step of reduction-projecting, by a projection optical system, the exposure light which has transmitted through the mask substrate, whereby, on a photo resist film formed on a first major surface of a semiconductor integrated circuit wafer, the integrated circuit pattern is imaged and thus transferred.

21. The method of manufacturing a semiconductor integrated circuit device according to Claim 20, wherein the wavelength of the exposure light is at least 100 nm but less than 250 nm.

22. The method of manufacturing a semiconductor integrated circuit device according to Claim 21, wherein the wavelength of the exposure light is at least 100 nm but less than 200 nm.

23. The method of manufacturing a semiconductor integrated circuit device according to Claim 22, wherein, in the peripheral portion of the first major surface of the mask substrate, a light screening metal region is provided.

24. The method of manufacturing a semiconductor integrated circuit device according to Claim 23, wherein, on the first major surface of the mask substrate, a pellicle is provided so as to cover said integrated circuit pattern, said pellicle being contact-fixed on the light screening region.

25. A method of manufacturing a semiconductor integrated circuit device, comprising:

(a) the step of irradiating far ultraviolet or vacuum ultraviolet exposure light from a first major surface side or a second major surface side of a mask substrate, which has, on the first major surface thereof, a light shielding pattern which is an integrated circuit pattern on a Lebenson type phase shift mask and comprises a photo resist pattern; and (b) the step of reduction-projecting, by a projection optical system, the exposure light which has transmitted through said mask substrate, whereby, on a first major surface of a semiconductor integrated circuit wafer, said integrated circuit pattern is imaged and thus transferred.

26. The method of manufacturing a semiconductor integrated circuit device according to Claim 25, wherein the wavelength of the exposure light is at least 100 nm but less than 250 nm.

27. The method of manufacturing a semiconductor integrated circuit device according to Claim 26, wherein, wherein the wavelength of the exposure light is at least 100 nm but less than 200 nm.

28. The method of manufacturing a semiconductor integrated circuit device according to Claim 27, wherein, in the peripheral portion of the first major surface, a light screening metal region is provided.

29. The method of manufacturing a semiconductor integrated circuit device according to Claim 28, wherein, on the first major surface of the mask substrate, a pellicle is provided so as to cover said integrated circuit pattern, the pellicle being contact-fixed on the light screening metal region.

30. A method of manufacturing a semiconductor integrated circuit device, comprising:

(a) the step of irradiating far ultraviolet or vacuum ultraviolet exposure light from a first major surface or a second major surface side of a mask substrate, the mask substrate having, in an integrated circuit pattern region of the first major surface thereof, a light shielding pattern which is an integrated circuit pattern on a mask and comprises a photo resist pattern, wherein a pellicle is contact-fixed in the peripheral portion of the integrated circuit pattern of said first major surface so as to cover said integrated circuit pattern; and (b) the step of reduction-projecting, by a projection optical system, the exposure light which has transmitted through the mask substrate, whereby, on a photo resist film formed on a first major surface of a semiconductor integrated circuit, the integrated circuit pattern is imaged and thus transferred.

31. The method of manufacturing a semiconductor integrated circuit device according to Claim 30, wherein the wavelength of the exposure light is at least 100 nm but less than 250 nm.

32. The method of manufacturing a semiconductor integrated Circuit device according to Claim 31, wherein the wavelength of the exposure light is at least 100 nm but less than 200 nm.

33. The method of manufacturing a semiconductor integrated circuit device according to Claim 32, wherein, in the peripheral portion of the first major surface of the mask substrate, a light screening metal region is provided.

34. The method of manufacturing a semiconductor integrated circuit device according to Claim 33, wherein, on the first major surface of the mask substrate, a pellicle is provided so as to cover the integrated circuit pattern, the pellicle being contact-fixed on the light screening metal region.

35. A method of manufacturing a semiconductor integrated circuit device, comprising:

(a) the step of irradiating far ultraviolet or vacuum ultraviolet exposure light from a first major surface or a second major surface side of a mask substrate, the mask substrate having, in an integrated circuit pattern region of said first major surface thereof, a light shielding pattern which is an integrated circuit pattern on a mask and comprises a photo resist pattern, wherein a protective film is formed on the photo resist pattern so as to cover said integrated circuit pattern region of the first major surface; and (b) the step of reduction-projecting, by a projection optical system, the exposure light which has transmitted through the mask substrate, whereby, on a photo resist film formed on a first major surface of a semiconductor integrated circuit wafer, the integrated circuit pattern is imaged and thus transferred.

36. The method of manufacturing a semiconductor integrated circuit device according to Claim 35, wherein the wavelength of the exposure light is at least 100 nm but less than 250 nm.

37. The method of manufacturing a semiconductor integrated circuit device according to Claim 36, wherein the wavelength of the exposure light is at least 100 nm but less than 200 nm.

38. A method of manufacturing a semiconductor integrated circuit device, comprising:
(a) the step of irradiating far ultraviolet or vacuum ultraviolet exposure light from a first major surface or a second major surface side of a mask substrate, the mask substrate having, in an integrated circuit pattern region of the first major surface thereof, a light shielding pattern which is an integrated circuit pattern on a mask and comprises a photo resist pattern, wherein a conductive ground film is formed beneath said photo resist pattern on said first major surface; and
(b) the step of reduction-projecting, by a projection optical system, said exposure light which has transmitted through the mask, whereby, on a photo resist film formed on a first major surface of a semiconductor integrated circuit wafer, said integrated circuit pattern is imaged and thus transferred.

39. The method of manufacturing a semiconductor integrated circuit device according to Claim 38, wherein the wavelength of the exposure light is at least 100 nm but less than 250 nm.

40. The method of manufacturing a semiconductor integrated circuit device according to Claim 39, wherein the wavelength of the exposure light is at least 100 run but less than 200 run.

41. Mask blanks for the reduction projection exposure of vacuum ultraviolet rays, comprising:
(a) a mask substrate which has first and second major surfaces and is transparent with respect to far ultraviolet rays or vacuum ultraviolet rays with a wavelength of at least 100 nm but less than 250 nm;
(b) a region coated with a light screening metal film which region is formed on the first major surface of the mask substrate; and
(c) an opening region provided in the portion corresponding to an integrated circuit pattern region in the central portion of the region coated with a light screening metal film.

42. The method of manufacturing a semiconductor integrated circuit device according to Claim 41, wherein the wavelength of the exposure light is at least 100 nm but less than 200 nm.

43. A method of manufacturing an optical mask for performing the reduction projection exposure of a semiconductor integrated circuit device, wherein far ultraviolet rays or vacuum ultraviolet rays are used as the exposure light, comprising:
(a) the step of placing a mask substrate on a processed mask holding portion of a mask writer;
(b) the step of detecting a position detecting pattern provided in the peripheral portion of a first major surface of the mask substrate; and
(c) the step of calibrating an integrated circuit pattern to the position where it is to be written, on the basis of the result of the above-mentioned detection, whereby the integrated circuit pattern is written on an integrated circuit pattern region on said first major surface.

44. The method of manufacturing a semiconductor integrated circuit device according to Claim 43, wherein the wavelength of the exposure light is at least 100 nm but less than 250 nm.

45. The method of manufacturing a semiconductor integrated circuit device according to Claim 44, wherein the wavelength of the exposure light is at least 100 nm but less than 200 nm.

46. An optical mask comprising:
(a) a mask substrate which has first and second major surfaces and is transparent with respect to far ultraviolet or vacuum ultraviolet rays;
(b) an integrated circuit pattern region of the first major surface of the mask substrate;
(c) an integrated circuit pattern on the mask substrate, the integrated circuit pattern being formed of a light shielding pattern in said integrated circuit pattern region of the mask substrate and being imaged on a photo resist film formed on a first major surface of a semiconductor integrated circuit wafer, by reduction-projecting, by means of a projection optical system, the exposure light which has transmitted through the mask substrate, the integrated circuit pattern being thus transferred; and
(d) a light screening metal region provided in the peripheral region of the first major surface of the mask substrate.

47. An optical mask comprising:
(a) a mask substrate which has first and second major surfaces and is transparent with respect to far ultraviolet or vacuum ultraviolet rays;
(b) an integrated circuit pattern region of the first major surface of the mask substrate; and
(c) an integrated circuit pattern on the mask substrate, the integrated circuit pattern being formed, in the integrated circuit pattern region of the mask substrate, of a halftone light shielding pattern which comprises a photo resist pattern, the integrated circuit pattern being imaged on a photo resist film formed on a first major surface of a semiconductor integrated circuit wafer, by reduction-protecting, by means of a projection optical system, the exposure light which has transmitted through the mask substrate, the integrated circuit pattern being thus transferred.

48. An optical mask comprising:
(a) a mask substrate which has first and second major surfaces and is transparent with respect to far ultraviolet or vacuum ultraviolet rays;
(b) a Lebenson type phase shift means formed on said first major surface or second major surface;
(c) an integrated circuit pattern region of the first major surface of the mask substrate; and
(d) an integrated circuit pattern on a mask substrate, the integrated circuit pattern being formed, in said integrated circuit pattern region of the mask substrate, of a light shielding pattern which comprises a photo resist pattern, the integrated circuit pattern being imaged on a photo resist film formed on a first major surface of a semiconductor integrated circuit wafer, by reduction-projecting, by means of a projection optical system, the exposure light which has transmitted through the mask substrate, the integrated circuit pattern being thus transferred.

49. An optical mask comprising:
(a) a mask substrate which has first and second major surfaces and is transparent with respect to far ultraviolet rays or vacuum ultraviolet rays;

(b) an integrated circuit pattern region of the first major surface of the mask substrate;

(c) an integrated circuit pattern on the mask substrate, the integrated circuit pattern being formed, in said integrated circuit pattern region of the mask substrate, of a halftone light shielding pattern which comprises a photo resist pattern, the integrated circuit pattern being imaged on a photo resist film formed on a first major surface of a semiconductor integrated circuit wafer, by reduction-projecting, by means of a projection optical system, the exposure light which has transmitted through the mask substrate, the integrated circuit pattern being thus transferred; and (d) a protective film covering the integrated circuit pattern region and the light shielding pattern.

Further, outlines of still others of the inventions disclosed in the present application will be briefly described below.

50. The present invention comprises (a) the step of depositing a transparent conductive film on a first major surface of a mask substrate, (b) the step of depositing a resist film on the transparent conductive film, c) the step of writing a predetermined integrated circuit pattern on the resist film in the state in which the transparent conductive film is grounded, (d) the step of performing a developing treatment after the step (c), whereby a light shielding pattern constituted of the transparent conductive film and the resist film is formed on the first major surface of the mask substrate, (e) the step of holding the optical mask, which has been fabricated by, the foregoing steps (a) to (d), in the state in which the light shielding pattern constituted of the conductive film and the resist film is not contacted with the mounting portion of an aligner, and then, irradiating far ultraviolet rays or vacuum ultraviolet rays from a second major surface side of the optical mask, and (f) the step of reduction-projecting by means of a projection optical system the exposure light which has transmitted through the mask substrate, whereby, on a photo resist film formed on a first major surface of a semiconductor integrated circuit wafer, the integrated circuit pattern is transferred.

51. The invention comprises (a) the step of depositing a resist film on a first major surface of a mask substrate, (b) the step of depositing a water-soluble conductive film on the resist film, (c) the step of writing a predetermined integrated circuit pattern on the resist film in the state in which the water-soluble conductive film is grounded, (d) the step of removing the water-soluble conductive film by performing a developing treatment after the step (c), and forming a light shielding pattern, which comprises a resist film, on the first major surface of the mask substrate, (e) the step of holding the optical mask, which has been fabricated through the foregoing steps (a) to (d), in the state in which the light shielding pattern thereof is not contacted with the mounting portion of an aligner, and then, irradiating far ultraviolet rays or vacuum ultraviolet rays from a second major surface side of the optical mask, and (f) the step of reduction-projecting by means of a projection optical system the exposure light which has transmitted through the mask substrate, whereby, onto a photo resist film formed on a first major surface of a semiconductor integrated circuit wafer, the integrated circuit pattern is transferred.

52. The invention comprises (a) the step of depositing a light screening film, which comprises a metal, on the whole of a first major surface of a mask substrate, (b) the step of patterning the light screening film to form a common light shielding pattern on the first major surface of the mask substrate, (c) the step of depositing a resist film on the whole of the first major surface of the mask substrate after the foregoing step (b), and (d) the step of patterning the resist film, whereby a light screening pattern for transferring an integrated circuit-pattern onto an integrating circuit pattern region is formed on the first major surface of the mask substrate.

53. The invention comprises (a) the step of depositing a resist film on a first major surface of a mask substrate and, thereafter, patterning the resist film, whereby a light shielding pattern for forming an integrated circuit pattern is formed, (b) the step of depositing a phase shift film on the first major surface of the mask substrate after the foregoing step (a), (c) the step of digging a groove in the phase shift film so as to produce a phase difference between the light rays which have transmitted through the mask substrate, (d) the step of mounting, on the mounting portion of an aligner, the optical mask fabricated through the foregoing steps (a) to (c), and then, irradiating far ultraviolet rays or vacuum ultraviolet rays from a second major surface side of the optical mask, and (e) the step of reduction-projecting by means of a projection optical system the exposure light which has transmitted through the mask substrate, whereby, onto a photo resist film formed on a first major surface of a semiconductor integrated circuit wafer, the integrated circuit pattern is transferred.

54. The invention comprises (a) the step of depositing a resist film on a first major surface of a mask substrate, and then, pattering this resist film to form a halftone pattern, which is a pattern for forming an-integrated circuit pattern and has the function of causing a phase difference between the transmitted light rays and lowering the intensity of the transmitted light rays than that of the light rays which have transmitted through the mask substrate, (b) the step of mounting on the mounting portion of an aligner the optical mask fabricated through the foregoing step (a), and then, irradiating far ultraviolet rays or vacuum ultraviolet rays from a second major surface side of the optical mask, and (c) the step of reduction-projecting by means of a projection optical system the exposure light which has transmitted through the mask substrate, whereby, onto a photo resist film formed on a first major surface of a semiconductor integrated circuit wafer.

55. The invention comprises (a) the step of depositing a resist film on a first major surface of a mask substrate, and then, patterning this resist film to form a halftone pattern which is pattern for forming an integrated circuit pattern and has the function of causing a phase difference between the transmitted light rays and lowering the intensity of the transmitted light rays than that of the light rays which have transmitted through the mask substrate, (b) the step of using the halftone pattern as an etching mask and digging grooves in the mask substrate exposed from therefrom, whereby the phase difference of the transmitted light rays is adjusted, (c) the step of mounting on the mounting portion of an aligner the optical mask fabricated through the foregoing steps (a) and (b), and then, irradiating far ultraviolet rays or vacuum ultraviolet rays from a second major surface side of the optical mask, and (d) the step of reduction-projecting by means of a projection optical system the exposure light which has transmitted through the mask substrate, whereby, onto a photo resist film formed on a first major surface of a semiconductor integrated circuit wafer, the integrated circuit pattern is transferred.

56. The invention comprises (a) the step of depositing, on a first major surface of a mask substrate, a phase adjusting film for adjusting the phase of the transmitted light, (b) the step of depositing a resist film on the phase adjusting film, and then, patterning this resist film to form a halftone pattern, which is a pattern for forming an integrated circuit pattern and has the function of causing a phase difference between the transmitted light rays and lowering the intensity of the transmitted light than that of the light rays which have transmitted through the mask substrate, (c) the step of using the halftone pattern as an etching mask and shaving off the phase adjusting film, which is exposed from the halftone pattern, wholly or by an amount corresponding to a predetermined thickness, whereby the phase difference of the transmitted light rays is adjusted, (d) the step of mounting on the mounting portion of an aligner the optical mask fabricated through the foregoing steps (a) to (c), and then, irradiating far ultraviolet rays or vacuum ultraviolet rays from a second major surface side of the optical mask, and (e) the step of reduction-projecting by means of a projection optical system the exposure light which has transmitted through the mask substrate, whereby, onto a photo resist film formed on a first major surface of a semiconductor integrated circuit wafer, the integrated circuit pattern is transferred.

57. The invention is constituted in such a manner that, in the preceding Item 54, 55 or 56, a light screening metal region is provided in the peripheral portion of the first major surface of the mask substrate.

58. The invention is constituted in such a manner that, in any one of the foregoing Items 50, 51 and 53 to 57, the wavelength of the exposure light is at least 100 nm but less than 250 nm.

59. The invention is constituted in such a manner that, in any one of the foregoing Items 50, 51 and 53 to 57, the wavelength of the exposure light is at least 100 nm but less than 200 nm.

DESCRIPTION OF THE PREFERRED EMBODIMENTS

Figure 1A:
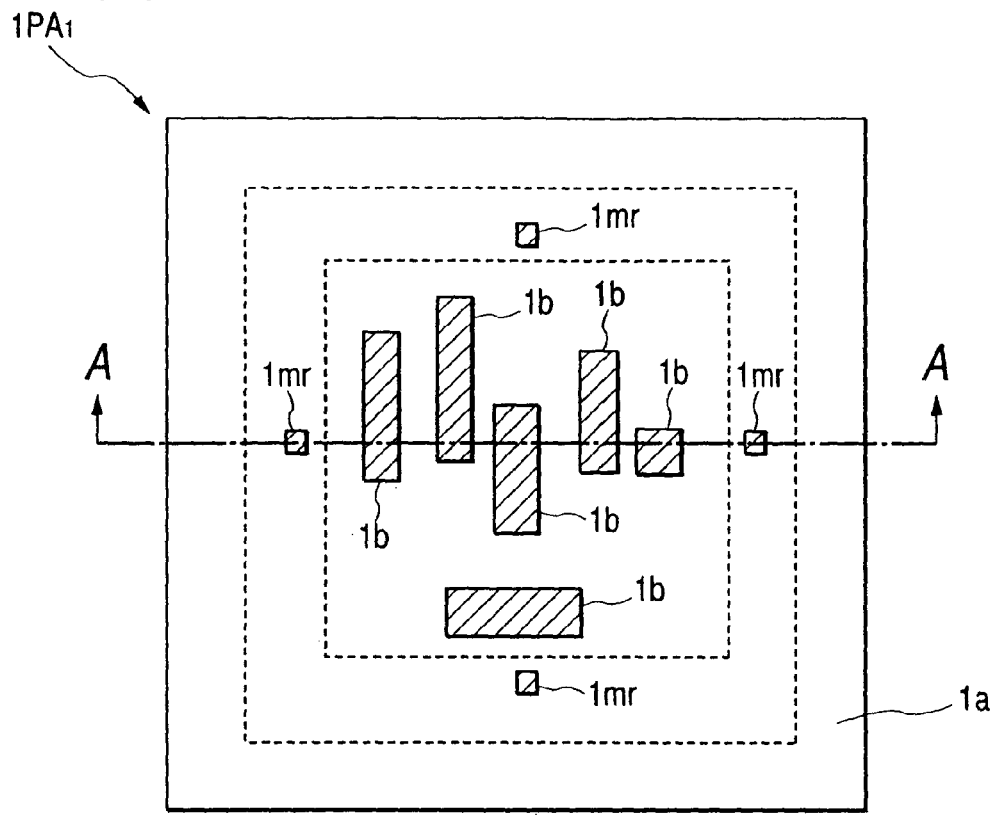
FIG. 1(a) is a plan view of the optical mask used in the method of manufacturing a semiconductor integrated circuit device according to an embodiment of the present invention.

Before giving a detailed description of the present invention, the meanings of some terms used in the present application will first be explained.

1. Device surface means a major surface of a semiconductor wafer, on which a device pattern corresponding to a plurality of chip regions is formed by photolithography.

2. Semiconductor integrated circuit wafer (semiconductor integrated circuit substrate) or semiconductor wafer (semiconductor substrate) means a monocrystalline silicon substrate (generally, in an approximately plane, circular shape), a sapphire substrate, a glass substrate or another insulating, semi-insulating or semiconductor substrate or a composite substrate comprising them, which is used for the manufacture of a semiconductor integrated circuit.

3. Organic SOG (Spin On Glass) is generally an interlayer dielectric film material which is formed in such a manner that a high-molecular resin in which various organofunctional groups are bonded to a siloxane polymer or a copolymer prepared from siloxane polymer and another monomer is dissolved in a solvent and spin-coated on a semiconductor wafer. In general, an organic SOG has the feature that, unlike the case of an inorganic SOG, cracks are hard to be caused therein after its curing, so that the organic SOG film can be formed somewhat thick. Among the organic siloxane series interlayer film materials, there are some which are formed into films by CVD (Chemical Vapor Deposition).

4. When an etching stopper is mentioned, an etching stopper whose etching selective ratio to the concerned etching stopper film is 4 or higher is referred to (in case it,is mentioned that the etching selective ratio of A to B is X, it means that the etching rate of A is X, and the etching rate of B is 1). As etching stopper films, coated stopper films and the like are also included.

5. Masking layers generally means resist films but, here, include inorganic masks, non-photosensitive organic masks and the like, too.

6. When the terms "light screening region", "light screening film" or "light shielding pattern" are mentioned, it indicates that the above-mentioned region has an optical characteristic such that, of the exposure light irradiated to the region, less than 40% is allowed to transmit through the region. In general, what allows 30% or less of the exposure light to transmit through the region is used. On the other hand, when the terms "transparent" and "transparent film" are mentioned, it indicates that the film has an optical characteristic such that, of the exposure light irradiated to the concerned region, 60% or more is allowed to transmit through it. In general, what allows 90% or more of such irradiated exposure light to transmit through it is used.

7. "Photo resist pattern" means a film pattern obtained by patterning a photosensitive organic film using a photolithography technique. In addition, as such a photo resist pattern, a mere resist film which has no opening at all with respect to the portion concerned is also included.

8. The pattern surface of a mask is divided into the following regions: The region in which the integrated circuit pattern transferred is disposed "integrated circuit pattern region", the region covered with a pellicle "pellicle-covering region", the pellicle-covering region other than the integrated circuit pattern region "peripheral region of the circuit pattern", the external region covered with no pellicle "peripheral region", the inner region of the peripheral region in which an optical pattern is formed "inner peripheral region", and the other portion of the peripheral region which is used for vacuum suction or the like "outer peripheral region".

9. In the field of semiconductors, ultraviolet rays are divided as follows: rays which have a wavelength less than about 400 nm, but higher than about 50 nm, are called ultraviolet rays, rays which have a wavelength of 300 nm or higher are called near ultraviolet rays, rays having a wavelength less than 300 nm, but higher than 200 nm, are called far ultraviolet rays, and rays which have a wavelength of 200 nm or less are called vacuum ultraviolet rays. Main embodiments of the present invention have been described with respect mainly to the vacuum ultraviolet range with a wavelength of 200 nm or less, but, if alteration is made as described with reference to the following embodiments, then it is a matter of course that the present invention is applicable even in the case of the far ultraviolet range based on use of a KrF excimer laser having a wavelength less than 250 nm, but higher than 200 nm. Further, it is also possible to apply the principle of the present invention even to the shortest wavelength end range of the ultraviolet rays having a wavelength less than 100 nm, but higher than 50 nm.

10. When "metal" is mentioned concerning the mask light-screening material, chromium, chromium oxide and similar compounds of other metals are meant; and, from a wider viewpoint, single substances, compounds, and composites which each contain a metal element and have a light screening function are also included.

11. "Halftone mask" is a kind of phase shift mask and has a halftone shifter in which the transmissivity of the halftone film serving as a shifter and also as a light screening film is at least 1%, but less than 40%, and the phase shift amount thereof as compared with the portion in which no halftone shifter inverts the phase of the light.

12. "Levenson type phase shift mask" is a kind of phase shift mask constituted in such a manner that the phases of openings adjacent to each other,but separated from each other by a light screening region,are inverted with respect to each other, so that, by the interference action thereof, a clear picture is intended to be obtained.

In the following embodiments, description will be made, if required, by dividing each embodiment into a plurality of sections or embodiments for convenience's sake, but, unless particularly specified, they are not irrelevant to each other; but each is in a relationship of being a modification of a part or the whole of the other or a detailed or supplementary explanation of the other.

Further, in the following embodiments, in case of referring to a number and the like (including the number of individual elements, numerical value, amount, range, etc.) of elements, the invention is not limited to the specific number, but can be more or less than the specific number, unless otherwise specified and except for cases such as the case where it is clear in view of the principle that limitation is made to a specific number.

Further, in the following embodiments, it is a matter of course that the constitutional elements (including the element steps etc.) of the embodiments are not always indispensable unless otherwise specified, except for cases, such as the case where it is considered that, in view of the principle, the constitutional elements are clearly indispensable.

Similarly, in the following embodiments, when the shape, the positional relationship, etc. of a constitutional element are referred to, those which are substantially approximate or similar to the particular shape and the like are included unless otherwise specified, except for cases, such as the case where it is considered, in view of the principle, that it is clearly not so. The same thing applies also to the above-mentioned numerical value and range.

Further, when a semiconductor integrated circuit device is referred to in the present specification, it is to be considered that not only device made on a semiconductor or insulator substrate such as a silicon wafer, a sapphire substrate or the like, but also a TFT (Tin-Film-Transistor) and the device made on another insulating substrate made of glass such as STN (Super-Twisted-Nematic) liquid crystal or the like are also included.

The embodiments of the present invention will now be described in detail on the basis of the drawings. In all the drawings for explaining the embodiments, elements which have the same functions are referenced by the same reference numerals and symbols, whereby the repetition of the description thereof is omitted. Further, in the embodiments of the invention, a p-channel type MISFET (Metal Insulator Semiconductor Field Effect Transistor) will be abbreviated to PMIS, while an n-channel type MISFET will be abbreviated to NMIS.

Figure 1B:
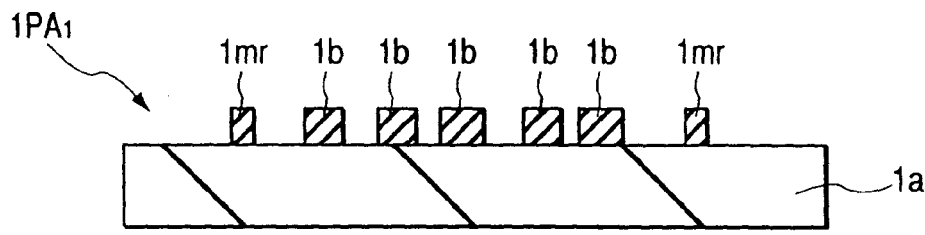
FIG. 1(b) is a sectional view taken along the line A—A in FIG. 1(a)
Figure 1C:
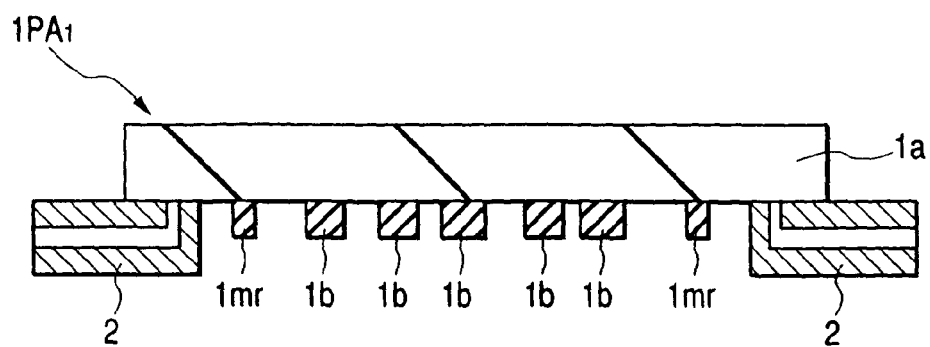
FIG. 1(c) is a sectional view of the essential part of the optical mask, showing the state in which the optical mask shown in FIGS. 1(a) and 1(b) is mounted on a predetermined apparatus.

Embodiment 1:

FIG. 1(a) is a plan view of the photo mask used for the method of manufacturing a semiconductor integrated circuit device according to an embodiment of the invention, FIG. 1(b) is a sectional view taken along the line A—A in FIG. 1(a), and FIG. 1(c) is a sectional view of the photo mask shown in FIG. 1(a) and FIG. 1(b), showing the state in which the photo mask is mounted on a predetermined apparatus. The broken lines in FIG. 1(a) are provided for easier understanding of the description, but not formed in the actual product.

The photo mask 1PA1 according to this Embodiment 1 is a reticle for imaging and transferring onto a semiconductor wafer the original picture of a semiconductor integrated circuit pattern, which is for example five times as large as the actual dimensions, through a reduction projection optical system or the like; this reticle is used in a projection aligner using as a light source vacuum ultraviolet rays such as, e.g., a argon fluoride (ArF) excimer laser beam (with a wavelength of 193 nm) or a fluorine gas ($F_2$)laser beam (with a wavelength of 157 nm).

A mask substrate 1a constituting this photo mask 1PA1 comprises, for example, a transparent synthetic quartz glass or the like formed into a square shape. The region surrounded by the innermost broken line in FIG. 1(a) shows the above-mentioned integrated circuit pattern region. In this integrated circuit pattern region, a light shielding pattern 1b is provided for transferring the integrated circuit pattern onto a semiconductor wafer. In this Embodiment 1, the light shielding pattern 1b is formed of a resist film. The structural details such as the material and the thickness of this resist film will be described later.

The region lying outside this integrated circuit pattern region is the peripheral region of the above-mentioned integrated circuit pattern. Of this peripheral region, the region surrounded by the broken line outside the integrated circuit pattern region is the region corresponding to the above-mentioned inner peripheral region, where a mark pattern 1mr for detecting the information of the photo mask 1PA1 is formed. In this Embodiment 1, this mark pattern 1mr is also formed of the above-mentioned resist film. As this mark pattern 1mr, there are, for example, an aligning mark and a calibrating mark used for the photo mask manufacture. The aligning mark is a mark used for effecting an alignment between the photo mask 1PA1 and an inspection equipment or an aligner, so that the aligning mask can inspect the position of the photo mask 1PA1 at the time of mounting the photo mask 1PA1 onto a "predetermined apparatus of the inspection equipment or the aligner. Further, the calibrating mark is a mark used for measuring the misalignment, the shape of the pattern or the pattern transfer accuracy. The mark pattern 1mr is a pattern which is not transferred onto the semiconductor wafer.

Further, the region lying outside this inner peripheral region is the above-mentioned outer peripheral region through which, at the time of mounting the photo mask 1PA1 onto a mounting portion 2 of the inspection equipment or the aligner, the photo mask 1PA1 comes into direct contact with the mounting portion 2. In this Embodiment 1, a pattern forming a resist film is not formed in the outer peripheral region. If a resist film is formed in this outer peripheral region, then, when the photo mask 1PA1 is mounted onto the inspection equipment or the aligner, the above-mentioned resist film is peeled off or shaven off, as a result of which foreign matter is produced; but, in this Embodiment 1, no resist film is formed in the outer peripheral region, so that inconveniences, such as the peeling-off of the resist film due to mechanical shocks and the production of foreign matter, could be prevented. As the mounting portion 2, a mounting portion with a vacuum holding mechanism is shown by way of example.

Next, an example of the method for the manufacture of the photo mask 1PA1 shown in FIG. 1(a) will be described.

Figure 2A:
FIG. 2(a) to FIG. 2(c) are sectional views of the essential part during steps of manufacturing the optical mask shown in FIG. 1(a).
Figure 2B:
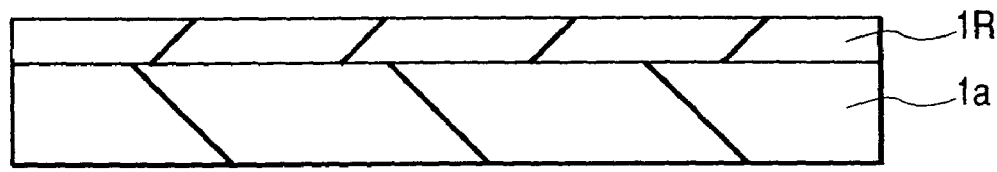

First, as shown in FIG. 2(a), a mask substrate 1a comprising a transparent synthetic quartz substrate with a thickness of, e.g., about 6 mm is prepared, and then, as shown in FIG. 2(b), a resist film 1R which has the properties of absorbing vacuum ultraviolet rays such as, e.g., an ArF excimer laser beam or an $F_2$ laser beam is applied over the whole of a major surface of the mask substrate 1a by the spin-coat method or the like. This resist film 1R is a resist film which is sensitive to an electron beam. Here, a novolac series resist film was formed to a thickness of, e.g., about 150 nm.

Figure 2C:
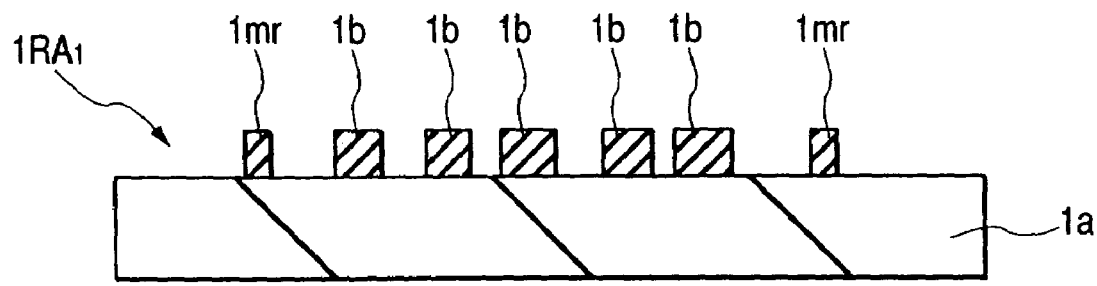

Subsequently, as shown in FIG. 2(c), the light shielding pattern 1b and the mark pattern 1mr each comprising a resist film were formed by the same method as the method of forming a desired pattern in an ordinary photo mask manufacturing process. Here, a measure to counter the charging of the electron beam, which will be described later, was taken. Further, the peripheral portion of the photo mask 1PA1 will serve as a portion contacted with the projection aligner, so that the resist film was removed; and thus, the occurrence of foreign matter due to the peeling-off or the shaving-off of the resist film was prevented.

For this resist film 1R, a material composed mainly of, e.g., a copolymer of α-methylstylene and α-chloroacrylic acid, novolac resin and quinine diazide, novolac resin and polymethyl pentene-1-sulfone, or chloromethylated polystylene was used. A so-called chemically amplified resist composed by incorporating an inhibitor and an acid generating agent into a phenol resin or a novolac resin can be used. Since the material of the resist film IR used here must have a light screening characteristic with respect to the light source of the projection aligner and also have the characteristic of having a sensitivity to the light source of the pattern lithography system, in the photo mask manufacturing process, such as, e.g., an electron beam or light with a wavelength of 230 nm or higher; the material of the resist film IR is not limited to the above-mentioned materials but can be variously altered. Further, the film thickness is not limited to 150 nm, either, but can be a value which can satisfy the above-mentioned condition.

Figure 3:
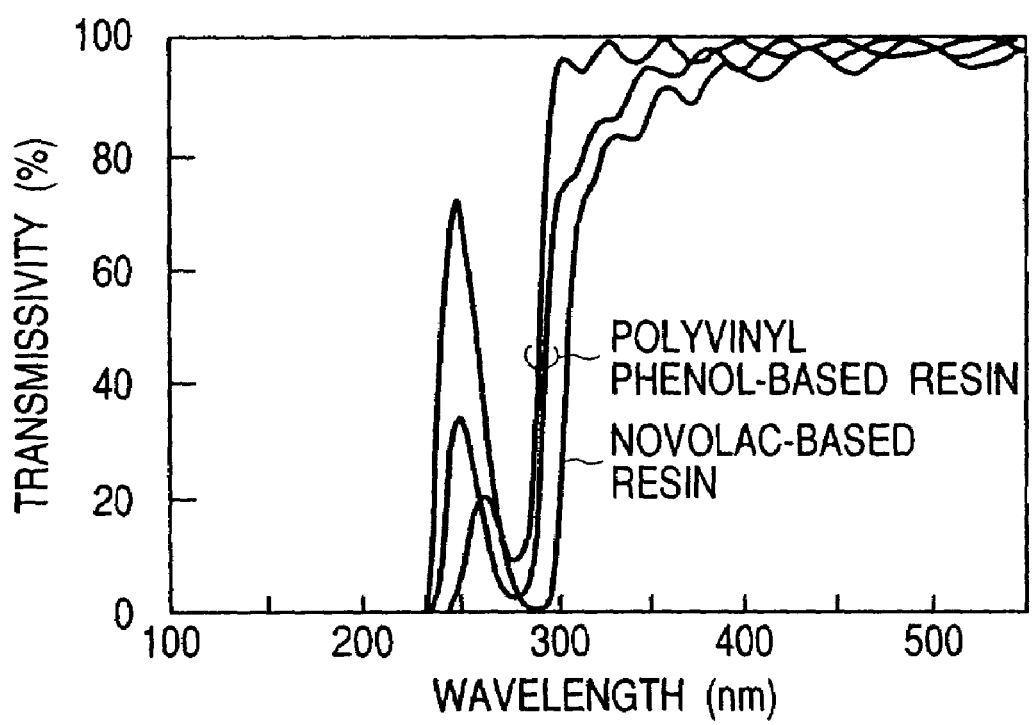
FIG. 3 is a graph showing the spectral transmissivity of a typical electron beam resist film.

FIG. 3 shows the spectral transmissivity of a typical electron beam resist film. In case a polyphenol series resin or a novolac series resin is formed into a film thickness of about 100 nm, its transmissivity is approximately zero at a wavelength of, e.g., about 150 to 230 nm; the electron beam resist film exhibits a sufficient mask effect with respect to an ArF excimer laser beam with a wavelength of 193 nm, an $F_2$ laser beam with a wavelength of 157 nm, and the like. Here, vacuum ultraviolet rays with a wavelength of 200 nm or less are employed, but the present invention is not limited to this.

As the mask material for the KrF excimer laser beam or the like with a wavelength of 248 nm, it is necessary to use another material or to add an absorbing agent into the resist film. Further, after the light shielding pattern 1b and the mark pattern 1mr comprised of a resist film are formed, it is effective to subject the resist film to a so-called hardening treatment performed by adding a heat treatment step or powerfully irradiating ultraviolet rays previously, for the purpose of enhancing the resistance to the exposure light irradiation. Further, for the purpose of preventing the oxidation of the resist film, it is also effective to keep the pattern surface in an atmosphere of an inert gas such as, e.g., nitrogen ($N_2$). Further, as the pattern writing of the resist film, not only electron beam writing, but also pattern writing by ultraviolet rays with a wavelength of, e.g., 230 nm or higher can be applied. The spirit of the present invention lies in using the resist film directly as a mask and providing a practically usable mask structure. Accordingly, as the wavelength to be screened, the resist material and the mask substrate material, other wavelengths and materials may also be used.

By the use of this photo mask 1PA1, the pattern was transferred by a reduction projection exposure system. As the projection light of the reduction projection exposure system, an ArF excimer laser beam with a wavelength of, e.g., about 193 nm was used; the numerical aperture NA of the projection lens was for example about 0.68; and the coherence σ of the light source used was, for example, 0.7.

Figure 4:
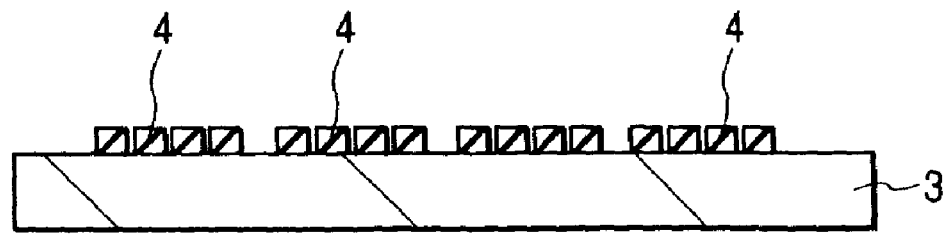
FIG. 4 is a sectional view of the essential part of a semiconductor wafer, wherein the photo resist pattern transferred onto the semiconductor wafer by the use of the optical mask shown in FIG. 1(a), is symbolically shown.

On the semiconductor wafer which would be used as a projected substrate, an ordinary positive resist film with a sensitivity to ArF was formed to a thickness of, e.g., about 300 nm. The alignment between the reduction projection exposure system and the photo mask 1PA1 was made by detecting the mark pattern 1mr formed on the photo mask 1PA1. For this alignment, a helium-neon (He-Ne) laser beam with a wavelength of, e.g., 633 nm was used. Due to this, the mark pattern 1mr constituted of a resist film has no light screening effect, and thus, the contrast between the light which has transmitted through the mark pattern 1mr and the light which has transmitted through the light transmitting portion cannot be obtained. Thus, the scattered light at the edge of the mark pattern 1mr was detected. As a result, as shown in FIG. 4, the semiconductor integrated circuit pattern on the photo mask 1PA1 was projected onto a major surface (first major surface) of a semiconductor wafer 3, and ordinary heat treatment and developing steps were carried out to form a resist pattern 4. As a result, approximately the same pattern transfer characteristic was obtained as in the case of using a photo mask (hereinafter referred to merely as the photo mask) formed on a mask substrate by the use, as a light shielding pattern, of a metal film such as, e.g., chrominum (Cr). The resist pattern 4 could be formed with a depth of field in which for example, at 0.19 μm, a line-and-space of 0.19 μm could be formed with a focal depth of 0.4 μm.

Figure 5:
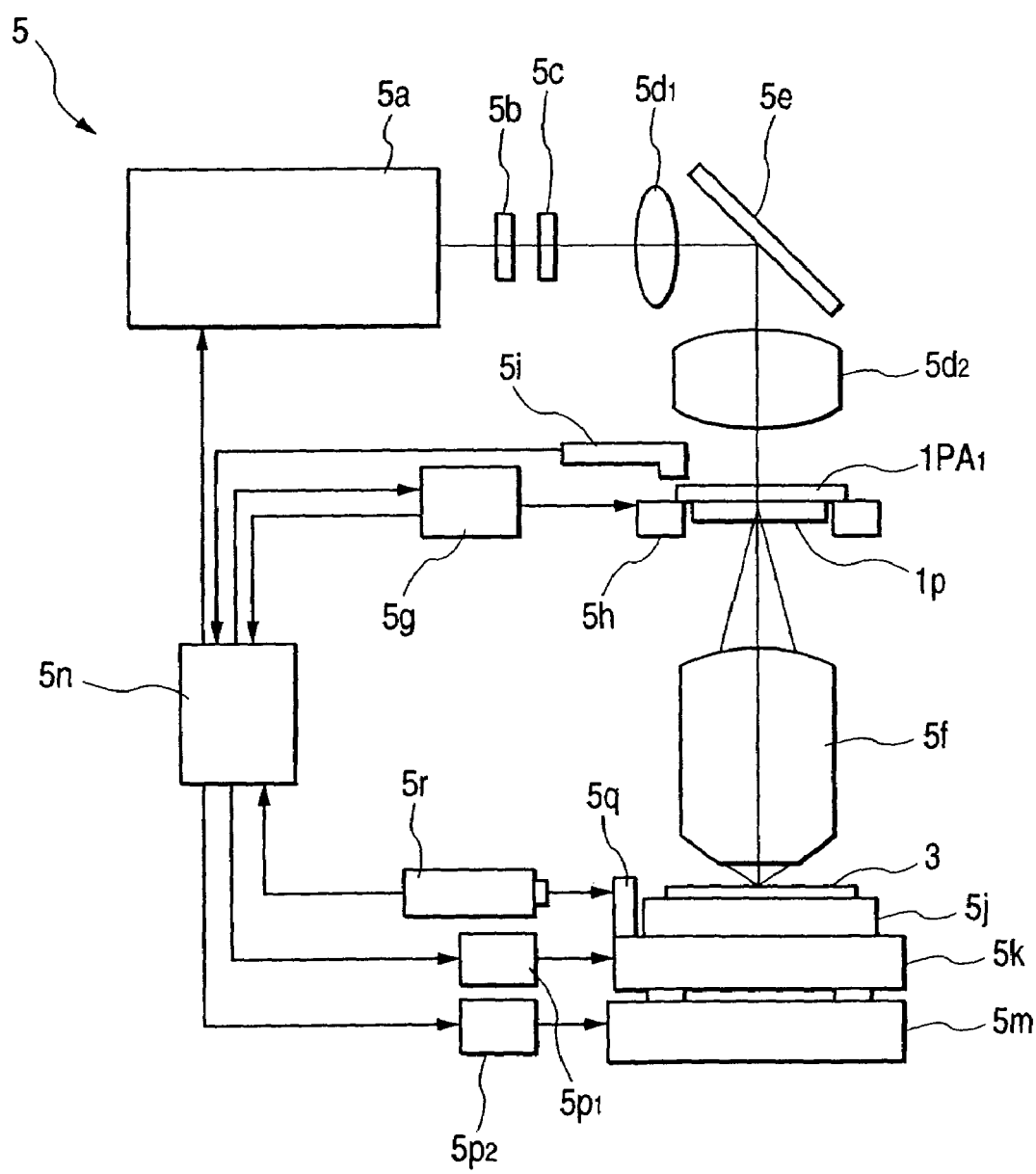
FIG. 5 is a schematic diagram of a reduction projection exposure system.

FIG. 5 shows an example of the reduction projection exposure system used for this exposure treatment. The exposure light emitted from a light source 5a of the reduction projection exposure system 5 irradiates the photo mask 1PA1 through a fly's eyes lens 5b, irradiation shape adjusting aperture 5c, condenser lenses 5d1, 5d2 and a mirror 5e. This photo mask 1PA1 is pjaced in the state in which the major surface (first major surface) on which the light shielding pattern is formed is directed downward (toward the semiconductor wafer 3 side). Therefore, the above-mentioned exposure light is irradiated from the back surface (second major surface) side of the photo mask 1PA1. By so doing, the mask pattern written on the photo mask 1PA1 is projected through a projection lens 5f onto the semiconductor wafer 3 which is a sample substrate. On the first major surface of the photo, mask 1PA1, a pellicle 1p for preventing a defective transfer of the pattern due to the attachment of foreign matter is provided in some cases. The photo mask 1PA1 is vacuum-sucked onto a mask stage 5h controlled by a mask position control means 5g, and aligned by a position detecting means 5i, whereby the center of the photo mask 1PA1 and the optical axis of the projection lens 5f are accurately aligned. The semiconductor wafer 3 is vacuum-sucked onto a sample stand 5j. The sample stand 5j is placed on a Z stage 5k which is movable in the direction of the optical axis of the projection lens 5f, that is, in the Z-axis direction, and the Z stage 5k is placed on an XY stage 5m. The Z stage 5k and the XY stage 5m are driven by respective driving means 5p1, 5p2 in response to control commands from a main control system 5n and can therefore be moved to a desired exposure position. The position is accurately monitored, by a laser precision-distance meter 5r, as the position of a mirror 5q fixed to the z stage 5k. Further, as the position detecting means 5i, an ordinary halogen lamp for example is used. In other words, it is not necessary to use any special light source for the position detecting means 5i (it is not necessary to introduce any novel technique or difficult technique anew), but a known reduction projection exposure system can be used. Therefore, the costs of the products manufactured by the use of the photo mask 1PA1 on which the light shielding pattern is formed of a resist film are not increased.

Next, the case where the technical concept of the present invention is applied to the process of manufacturing a semiconductor integrated circuit device which has, for example, a twin well type CMIS (Complimentary MIS) circuit will be described by the use of FIGS. 6 to 9.

Figure 6:
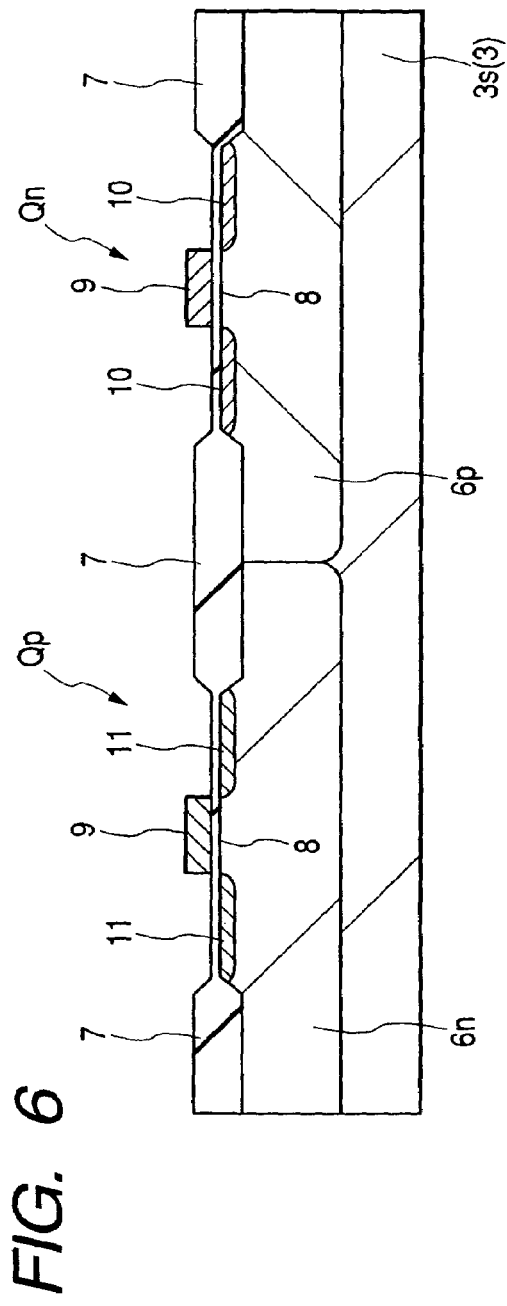
FIG. 6 is a sectional view of the essential part of the semiconductor wafer during a manufacturing step for the manufacture of a semiconductor integrated circuit device.

FIG. 6 is a sectional view of the essential part of the semiconductor wafer 3 during a step for the manufacture thereof. The semiconductor wafer 3 comprises, for example, a plane and approximately circular semiconductor thin-plate. A semiconductor substrate 3s constituting the semiconductor wafer 3 comprises, for example, n-type Si single-crystal, and, above the semiconductor wafer 3, for example, an n-well 6n and p-well 6p are formed. In the n-well 6n, for example, phosphorus or As, which is an n-type impurity, is introduced. Further, in the p-well 6p, for example, boron, which is a p-type impurity, is introduced.

On a major surface (first major surface) of this semiconductor substrate 3s, an isolating field oxide film 7 is formed by the LOCOS (Local Oxidization of Silicon) method or the like. The isolating portion may be formed in a groove shape. In other words, by burying an insulator film into a groove dug in the thickness direction of the semiconductor substrate 3s, the isolating portion may be formed.

In an active region surrounded by this field oxide film 7, an nMISQn and a pMISQp are formed. The gate oxide films 8 of the nMISQn and pMISQp each comprises, for example, a silicon oxide film, which is formed by the thermal oxidation method or the like. Further, the gate electrodes 9 of the nMISQn and the pMISQp are each formed in such a manner that a gate forming film comprising, for example, low-resistance polycrystalline silicon is deposited by the CVD method or the like, and then, the thus deposited film is formed by the photolithography technique using the above-mentioned reduction projection exposure system 5 and the photo mask 1PA1 and the ordinary etching technique. Though not particularly so limited, the gate length is, for example, about 0.18 μm. A semiconductor region 10 of the nMISQn is formed in a self-aligning manner with respect to the gate electrode 9, by introducing, for example, phosphorus or arsenic into the semiconductor substrate 3S by the ion implantation method or the like using the electrode 9 as a mask. Further, a semiconductor region 11, of the pMISQp is formed in a self-aligning manner with respect to the gate electrode 9 by introducing, for example, boron into the semiconductor substrate 3s by the ion implantation method or the like using the gate electrode 9 as a mask. However, the gate electrode 9 is not limited to the formation of, e.g., a single substance film of low-resistance polycrystal.line silicon, but the formation of the gate electrode 9 is variously modifiable; for example, there may be employed a so-called polycide structure obtained in such a manner that a silicide layer such as, e.g., tungsten silicide or cobalt silicide is provided on a low-resistance polycrystalline silicon film; or there can also be employed a so-called polymetal structure obtained in such a manner that a metal film such as, e.g., tungsten is provided on a low-resistance polycrystalline silicon film through a barrier conductor film such as, e.g., titanium nitride or tungsten nitride.

Figure 7:
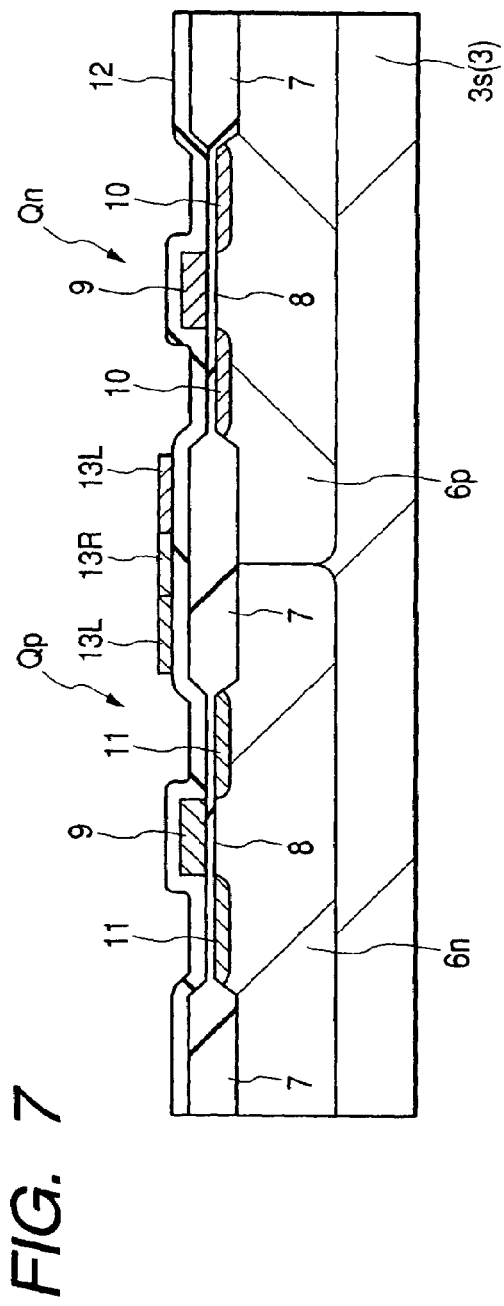
FIG. 7 is a sectional view of the essential part of the semiconductor wafer during the step, which follows the step shown in FIG. 6, for the manufacture of the semiconductor integrated circuit device.
Figure 8:
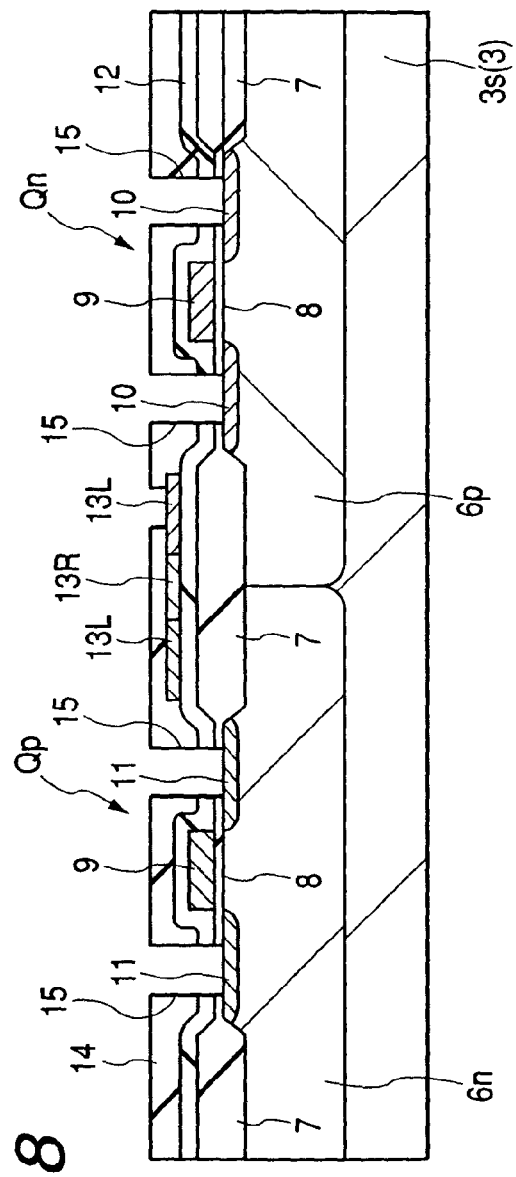
FIG. 8 is a sectional view of the essential part of the semiconductor wafer during the step, which follows the step shown in FIG. 7, for the manufacture of the semiconductor integrated circuit device.
Figure 9:
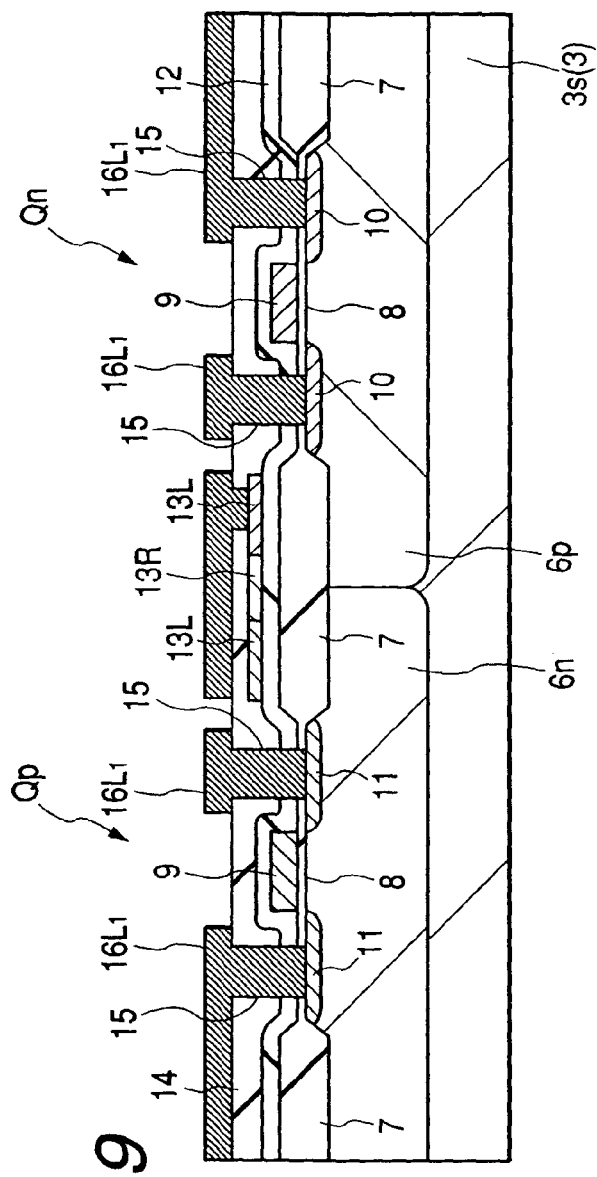
FIG. 9 is a sectional view of the essential part of the semiconductor wafer during the step, which follows the step shown in FIG. 8, for the manufacture of the semiconductor integrated circuit device.

First, on such semiconductor substrate 3s, an interlayer dielectric film 12 comprising, for example, a silicon oxide film is deposited by the CVD method or the like as shown in FIG. 7, and then, on the upper surface of the interlayer dielectric film 12, a polycrybtalline silicon film is deposited by the CVD method or the like. Subsequently, the polycrystalline silicon film is patterned by the photolithography technique using the above-mentioned reduction projection exposure system 5 and the photo mask 1PA1 and the ordinary etching technique, and thereafter, an impurity is introduced into a predetermined region of the polycrystalline silicon film thus patterned, whereby wirings 13L and a resistor 13R are formed. After this, as shown in FIG. 8, on the semiconductor substrate 3s, an SOG (Spin On Glass) film 14 comprising for example a silicon oxide film is deposited by the coating method or the like; and then, in the interlayer dielectric film 12 and the SOG film 14, connecting holes 15 are bored so as to expose portions of the semiconductor regions 10, 11 and the wiring 13L, by the photolithography technique using the above-mentioned reduction projection exposure system 5 and the photo mask 1PA1. Further, after a metal film comprising, for example, aluminum (AL) or an AL alloy is deposited by the sputtering method, this metal film is patterned by the photolithography technique and the ordinary etching technique using the reduction projection exposure system 5 and the photo mask 1PA1 and the ordinary etching technique, whereby a first layer wiring 16L1 is formed as shown in FIG. 9. After this, a second layer wiring is formed in the same manner as in case of forming the first layer wiring 16L1, thus manufacturing a semiconductor integrated circuit.

Thus, according to this Embodiment 1, for example, the following effects can be obtained:

(1) The light shielding pattern 1b and the mark pattern 1mr on the photo mask 1PA1 are constituted of a resist film, whereby the metal film etching step for forming the light shielding pattern and the step of removing the resist film used as a etching mask used for the metal film etching can be deleted. Due to this, the manufacturing costs of the photo mask 1 can be reduced. Further, the accuracy of the pattern dimensions on the photo mask 1PA1 can be enhanced. Further, the defects on the photo mask 1PA1 can be decreased.

(2) Since the various patterns comprising a resist film are not provided in that region of the outer periphery of the photo mask 1PA1 with which the mounting portion 2 of the inspection equipment or the aligner is contacted, it becomes possible to prevent the occurrence of foreign matter due to the peeling-off or shaving-off of the above-mentioned resist film on the photo mask 1PA1 when the photo mask 1PA1 is mounted onto the inspection equipment on the aligner doe to mechanical shocks.

(3) Due to foregoing Item (2), the deterioration in the inspection accuracy and the deterioration in the transfer accuracy of the exposure patterns due to the peeling-off and shaving-off of the photo mask 1PA1 can be prevented.

(4) Due to foregoing Item (2), it becomes possible to prevent the occurrence of short-circuit defects and open-circuit defects between the patterns on the semiconductor wafer 3 due to the peeling-off and the shaving-off of the resist film on the photo mask 1PA1.

(5) Due to foregoing Items (1) to (4), it becomes possible to enhance the reliability of the semiconductor integrated circuit device.

(6) Due to foregoing Items (2) to (4), the manufacturing yield of the semiconductor integrated circuit devices can be enhanced.

Embodiment 2:

This Embodiment 2 is identical with foregoing Embodiment 1 except that the method of manufacturing the photo mask 1PA1, differs from that of Embodiment 1.

In case of manufacturing the above-mentioned ordinary photo mask, when the resist pattern used as an etching mask for patterning the metal film for forming the light shielding pattern is formed by an electron beam writer or the like, the static electrification by the electrons produced at the time of performing electron beam writing can be prevented by which the metal film for forming the light shielding pattern is electrically connected to the earth. Accordingly, it is not necessary to perform electrification preventing treatment.

However, in case of manufacturing the above-mentioned photo mask 1PA1 according to the present invention, when a pattern is formed on the resist film IR by the use of an electron beam writer for forming the light shielding pattern, the electrons irradiated are cut off from escape since the mask substrate 1a and the resist film 1R are alike insulators; and thus, they are charged to adversely affect the formation of the resist pattern (i.e., the light shielding pattern).

Figure 10A:
FIG. 10(a) to FIG. 10(c) are sectional views of the essential part during manufacturing steps for the manufacture of the optical mask according to another embodiment of the present invention.
Figure 10B:
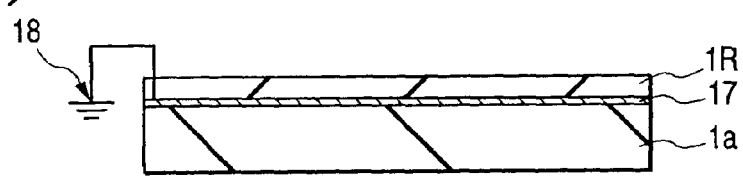
Figure 10C:
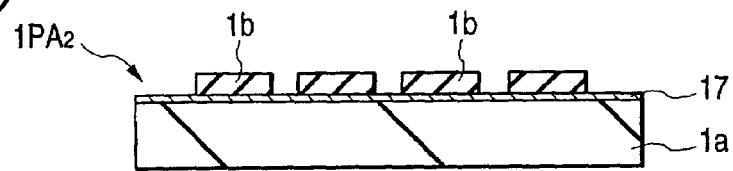

Thus, according to this Embodiment 2, the photo mask is manufactured in the following manner for example:

First, as shown in FIG. 10(a), a transparent conductive film 17 is deposited on the mask substrate 1a. As the transparent conductive film 17, an ITO (indium tin oxide) film can be used, for example. This transparent conductive film 17 need not be processed. The reference numeral 18 denotes the earth. Subsequently, as shown in FIG. 10(b), on this transparent conductive film 17, the above-mentioned resist film IR is provided by coating as in case of foregoing Embodiment 1. the transparent conductive film 17 is electrically connected to the earth 18. After this, as shown in FIG. 10(c), predetermined patterns (the light shielding pattern 1b and the mask pattern 1mr) are written on the resist film 1R by the use of the electron beam writer. In this case, according to this Embodiment 2, the electrons irradiated to the mask substrate 1a are allowed to escape to the earth 18 through the transparent conductive film 17. As a result, it becomes possible to suppress inconveniences, such as the deterioration in shape of the resist pattern and the positional shift due to the static electrification by the electrons. In this way, the photo mask 1PA2 is manufactured.

Figure 11A:
FIG. 11(a) to FIG. 11(a) are sectional views of the essential part during manufacturing steps for the manufacture of the optical mask according to still another embodiment of the invention.
Figure 11B:
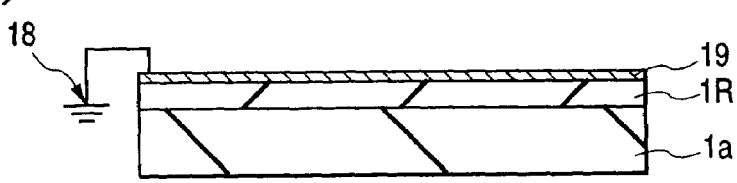
Figure 11C:
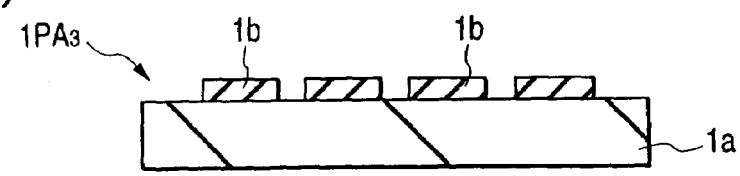

Further the following method may alternatively be adopted. First, after the mask substrate 1a is prepared as shown in FIG. 11(a), the resist film IR is provided by coating, as shown in FIG. 11(b), on a major surface of the mask substrate 1a as in case of foregoing Embodiment 1. Subsequently, according to this Embodiment 2, a water-soluble conductive organic film 19 is coated on the resist film IR. As the water-soluble conductive organic film 19, for example ESPACER (manufactured by Showa Denko K.K.) AQUASAVE (manufactured by Mitsubishi Rayon Co., Ltd.) or the like was used. After this, in the state in which the water-soluble conductive organic film 19 is electrically connected to the earth 18, the above-mentioned electron beam writing treatment was carried out. After this, at the time of developing the resist film, the water-soluble conductive organic film 19 was removed. By the above-mentioned method, the static electrification by the electron beam could be prevented, and inconveniences such as the abnormality in shape of the patterns and the positional shift of the patterns could be prevented. The photo mask 1PA3 is manufactured in this way.

Embodiment 3:

In this Embodiment 3, a light screening region constituted of a metal film is provided in the vicinity of the outer periphery of a mask substrate constituting a photo mask, and openings are provided in the light screening region, whereby an information detecting pattern is available for reading the information of the photo mask concerning, e.g., the above-mentioned aligning mark, the calibrating mark, etc. Except for this point, Embodiment 3 is identical with foregoing Embodiments 1, 2.

Figure 12A:
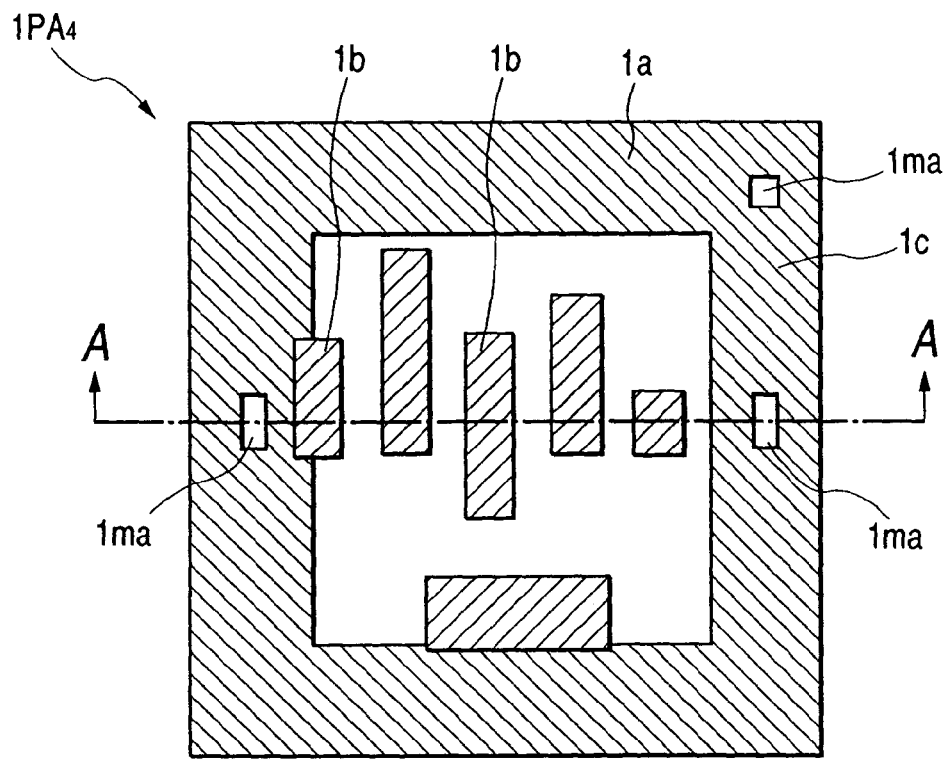
FIG. 12(a) is a plan view of the optical mask according to still another embodiment of the invention.
Figure 12B:
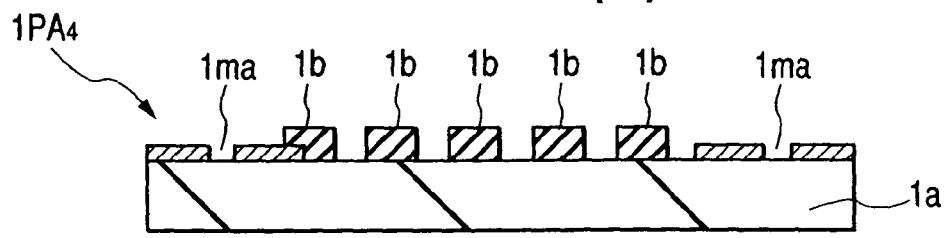
FIG. 12(b) is a sectional view taken along the line A—A in FIG. 12(a)
Figure 12C:
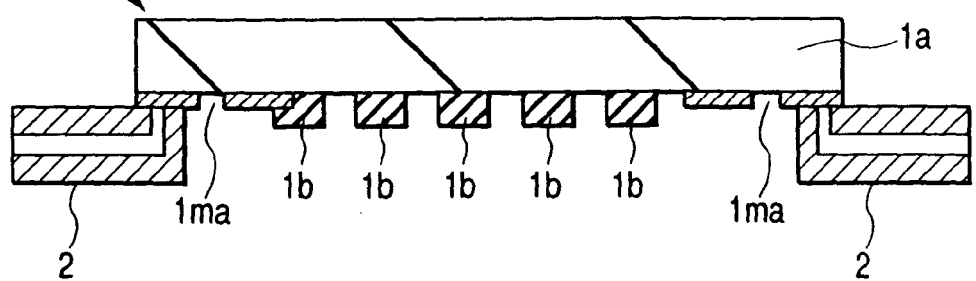
FIG. 12(c) is a sectional view of the essential part of the optical mask shown in FIG. 12(a) and FIG. 12(b), showing the state in which the optical mask is mounted on a predetermined apparatus.

FIGS. 12(a) to 12(c) show a concrete example of the photo mask according to this Embodiment 3. FIG. 12(a) is a plan view of the photo mask, FIG. 12(b) is a sectional view taken along the line A—A, and FIG. 12(c) is a sectional view of the photo mask, showing the state in which the photo mask shown in FIG. 12(a) and FIG. 12(b) is mounted on a predetermined apparatus.

In this Embodiment 3, a light shielding pattern (light screening metal region) 1c is formed in the vicinity of the outer periphery of a major surface of a mask substrate 1a constituting a photo mask 1PA4. This light shielding pattern 1c comprises a metal film such as, e.g., chromium (Cr) and is formed in a plane frame shape with a width, along the vicinity of the outer periphery of the mask substrate 1a so as to surround the above-mentioned integrated circuit pattern region of the mask substrate 1a. The region in which this light shielding pattern 1c is formed corresponds to the peripheral region, i.e., the inner peripheral region and the outer peripheral region, of the integrated circuit pattern of the above-mentioned photo mask 1PA1.

By the way, in this Embodiment 3, a mark pattern 1ma which has the same function as the above-mentioned mark pattern 1mr is formed in a portion of this light shielding pattern 1c. Here, however, the mark pattern 1ma is formed by light transmitting regions bored in portions of the light shielding pattern 1c. More specifically, the mark pattern 1ma is formed in such a manner that portions of the metal film constituting the light shielding pattern 1c are removed so as to expose the transparent mask substrate 1a lying beneath. Accordingly, in this Embodiment 3, in case the aligner described in connection with FIG. 5 is used, in other words, in case that an aligner which uses an ordinary halogen lamp or the like for the position detection of the photo mask is used, the contrast of the light which has transmitted through the mark pattern 1ma can be sufficiently obtained, so that the recognizing ability of the mark pattern 1ma can be enhanced. Due to this, the relative alignment between the photo mask 1PA4 and the aligner can be carried out with ease and yet with high accuracy. According to the result of the examination made by the present inventor, alignment equal to that of the above-mentioned ordinary photo mask has become possible.

Further, in this Embodiment 3, as shown in FIG. 12(c), the mounting portion 2 of the inspection equipment or the aligner is directly contacted with the light shielding pattern 1c. However, since a resist film is not formed on the light shielding pattern 1c, the occurrence of foreign matter due to the peeling-off and the shaving-off of the resist film does not occur even if the photo mask 1PA4 is mounted on the inspection equipment or the aligner. Further, the chromium or the like constituting the light shielding pattern 1c is hard, so that the occurrence of foreign matters due to the peeling-off or shaving-off of the chromium or the like is not caused, either. Therefore, the same effect as the effect described in connection with the foregoing Embodiment 1 can be obtained.

Also in this Embodiment 3, a light shielding pattern 1a constituted of a resist film 1R is likewise disposed in the integrated circuit pattern region in the center of the mask substrate 1a, as in the cases of foregoing Embodiments 1, 2.

Next, an example of the flow of a series of manufacturing steps for the manufacture of the photo mask 1PA4 according to this Embodiment 3 will be described.

The ordinary photo mask manufacturing step can be divided into a step of manufacturing a substrate (mask blanks) on which the light screening film made of chromium or a semitransparent film to be described later is formed on a whole major surface of the mask substrate and a photo mask manufacturing step for forming a semiconductor integrated circuit forming pattern on the mask blanks. The substrate and the photo mask are manufactured in different work sections or sites in some cases.

The photo mask manufacturing step according to this Embodiment 3 is divided into a mask blanks manufacturing step, a common light shielding pattern forming step for forming, in the outer peripheral portion of the mask substrate, a pattern is used in common by various projection aligners, and a resist pattern forming step. The respective steps are carried out at different work sites or in different manufacturing companies in some cases.

Figure 13A:
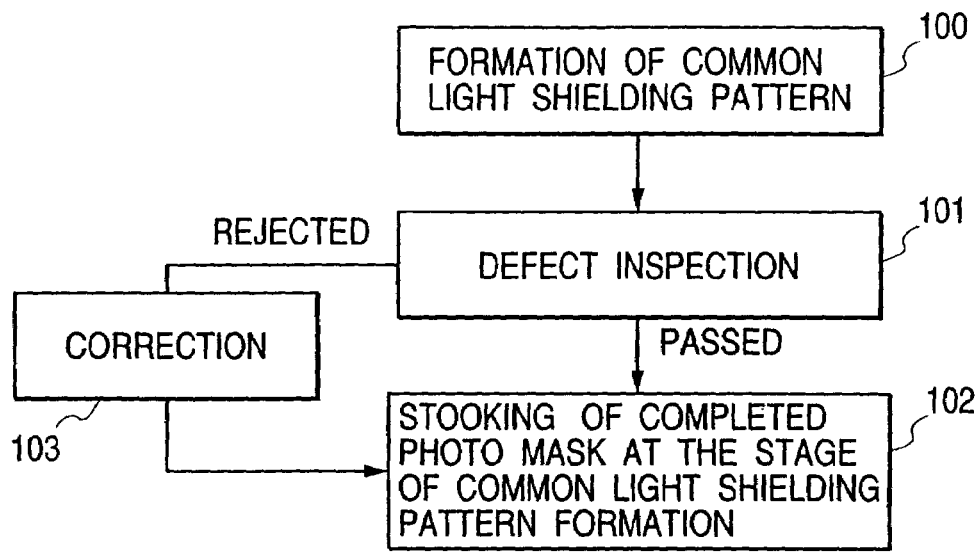
FIG. 13(a) and FIG. 13(b) are flow charts showing the steps of manufacturing the optical mask shown in FIG. 12(a).

For example, FIG. 13(a) shows the above-mentioned common light shielding pattern manufacturing step. As for the common pattern, various common patterns can be prepared in accordance with the respective semiconductor integrated circuits manufactured or the projection aligners used for the exposure treatment. First, after the common light shielding pattern (corresponding to the light shielding pattern 1c shown in FIG. 12(a)) (Step 100), the absence or presence of defects is inspected (Step 101). Here, in case that no defect is found, the common light shielding pattern is stocked as a completed photo mask at the common light shielding pattern forming stage (Step 102). On the other hand, in case that some defects exist, correction or the like is made (Step 103), and the common light shielding pattern is stocked after the correction (Step 102).

As stated above, in the photo mask manufacture according to this Embodiment 3, the mask substrate can be stocked during the photo mask manufacturing step, so that the manufacturing time and developing time of the semiconductor integrated circuit devices can be greatly shortened. In case of the ordinary photo mask, the substrate cannot be stocked during an intermediate step for the mask substrate manufacture, so that the whole course ranging from the deposition of the light screening film (the mask blanks manufacturing step) to the patterning of predetermined patterns must be continuously carried out, while, according to this Embodiment 3, the photo masks processed as far as the common light shielding pattern manufacturing step can be stocked. Due to this, in case of manufacturing or developing a semiconductor integrated circuit apparatus, at the time of forming the concrete mask patterns for a semiconductor integrated circuit pattern, the manufacture of the photo mask can be started from the stage where the photo mask was stocked, so that the photo mask manufacturing time can be shortened. Due to this, the step of forming the semiconductor integrated circuit pattern can be terminated in a shorter time. Therefore, the technical concept of the present invention is particularly suited to the manufacture of a photo masks for logic devices which are high in the frequency of developing product types.

Further, in case of the photo mask 1PA4 at the stage shown in FIG. 13(a), the light screening portion is mainly the outer peripheral portion of the mask substrate, so that a metal film, such as a chromium (Cr) film, may not be provided in the central portion of the substrate (mask blanks) in which a light screening film or a semitransparent film is formed over the whole major surface of the mask substrate or in the portion in which an element pattern is scheduled to be formed (that is, in the above-mentioned integrated circuit pattern region). Or, even if the metal film exists, defects such as pinholes etc. do not matter, so that the quality management of the mask blanks can be alleviated, and thus, the yield of the mask blanks can be greatly enhanced.

Figure 13B:
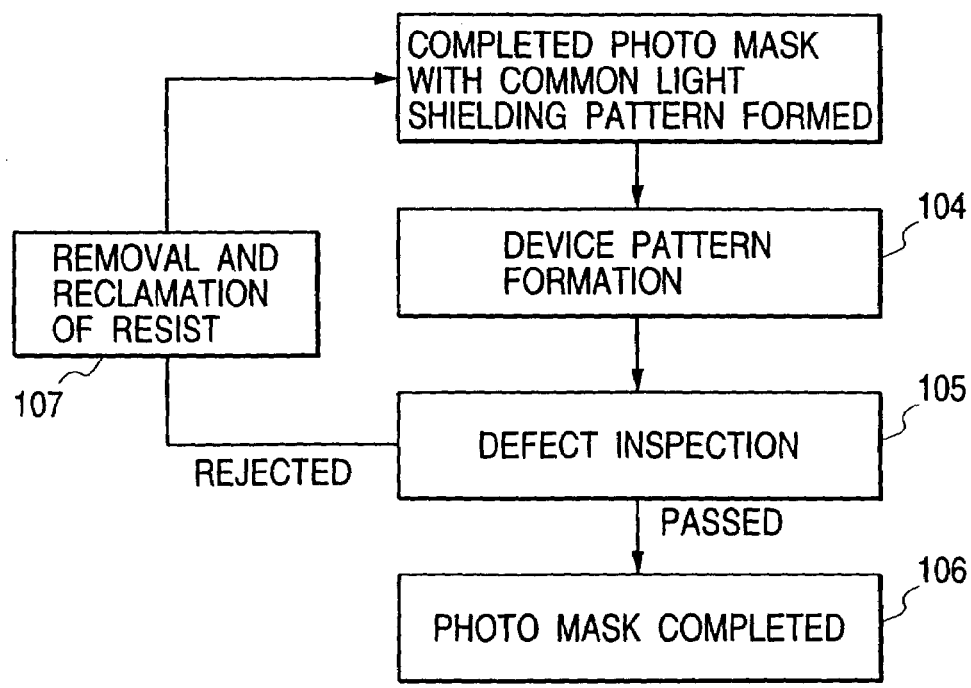

Subsequently, FIG. 13(b) shows the manufacturing step for forming a resist pattern. First, the mask blanks on which the common light shielding pattern is formed is used; and, in the integrated circuit pattern region, the resist film is subjected to exposure, development and hardening treatment, whereby a device manufacturing resist pattern (corresponding to the light shielding pattern 1b shown in FIG. 12(a)) (Step 104). Subsequently, inspections such as a defect inspection and a dimensional inspection are carried out to the mask substrate (Step 105). In case the inspected product has passed these inspections, the completion of a photo mask follows (Step 106). However, as a result of these inspections, the resist film of the photo masks which have failed to pass the inspections and thus are below the standards are removed (Step 107), which are put to reuse. As stated above, in this Embodiment 3, the mask blanks with common light shielding patterns can be reused. In other words, in case the light shielding pattern for the manufacture of devices is formed of a metal film, it is difficult to remove it for reuse, in view of securing the quality of the photo mask. However, to remove and reuse the resist film according to this Embodiment 3 does not take much time, and further, it can be easily done without lowering the quality of the photo mask. Thus, it follows that the effective utilization of resources becomes possible.

Next, an example of the concrete manufacturing method will be described concerning each step of the above-mentioned photo mask manufacturing steps.

Figure 14A:
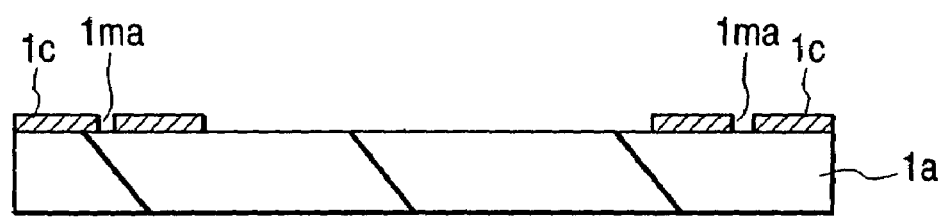
FIG. 14(a) and FIG. 14(b) are sectional views of the essential part during manufacturing steps for the manufacture of the optical mask shown in FIG. 12(a).

First, as shown in FIG. 14(a), a metal film with high light screening properties such as, e.g, a chromium film is deposited on a major surface of a mask substrate 1a, and thereafter, this is patterned by the photolithography technique and the etching technique, whereby the above-mentioned light shielding pattern 1c and the mark pattern 1ma are formed on the major surface of the mask substrate 1a. In the integrated circuit pattern region in the central portion of the mask substrate 1a, the light shielding pattern 1c is not formed, an opening is bored, and thus, the transparent mask substrate 1a is exposed. The steps as far as this step correspond to the manufacturing steps shown in FIG. 13(a).

Figure 14B:
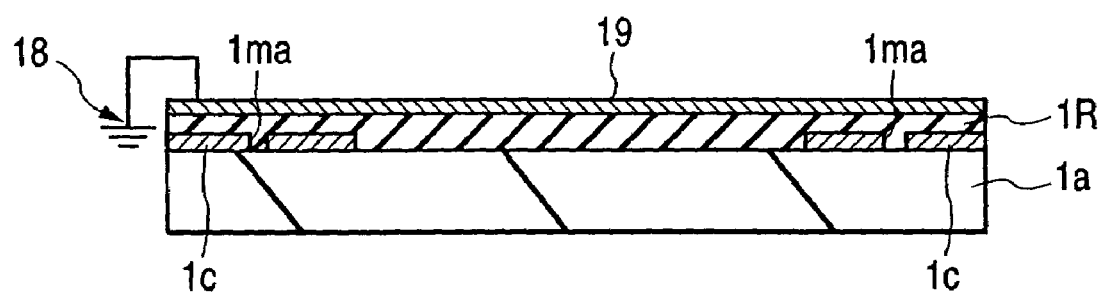

Next, as shown in FIG. 14(b), on the major surface of the mask substrate 1a on which the step of forming the common light shielding pattern is completed, the above-mentioned resist film 1R is coated so as to cover the light shielding pattern 1c, and thereafter, the above-mentioned water-soluble conductive organic film 19 is applied on the resist film 1R thus coated. Subsequently, as in case of the foregoing Embodiment 2, the above-mentioned electron beam writing treatment was carried in the integrated circuit pattern region of the mask substrate 1a, in order to form a light shielding pattern for the semiconductor integrated circuit pattern, in the state in which the water-soluble conductive film 19 is electrically connected to the earth 18. After this, the resist film 1R was subjected to a developing treatment, the water-soluble conductive organic film 19 was removed, and thus, as shown in FIG. 12(a), a light shielding pattern 1b comprising a resist film was formed in the integrated circuit pattern region of the mask substrate 1a. The steps as far as this step correspond to the manufacturing steps shown in FIG. 13(b).

According to such Embodiment 3, the following effects can be obtained in addition to the effects obtained by the foregoing Embodiments 1, 2:

1. Since the light shielding pattern 1c is provided in the outer periphery of the mask substrate 1a of the photo mask 1PA4, and, by removing a portion thereof, the mark pattern 1ma is formed, the accuracy in detection of the mark pattern can be enhanced. Accordingly, the ability of detecting the information of the photo-mask 1PA4 can be enhanced (2) Due to foregoing Item (1), the accuracy in detection of the calibrating mark of the photo mask 1PA4 can be enhanced in case of inspecting the photo mask 1PA4, so that it is possible to enhance the inspection accuracy of the photo mask 1PA4. Therefore, the reliability of the photo mask 1 can be enhanced.

(3) Due to foregoing Item (1), the accuracy in alignment between the photo mask 1PA4 and the aligner can be enhanced. Therefore, the accuracy in the transfer of the patterns onto the semiconductor wafer and the alignment accuracy can be enhanced.

(4) Due to the foregoing Items (1), (2), (3), the reliability and manufacturing yield of the semiconductor integrated circuit devices manufactured by the use of the photo mask 1PA4 can be enhanced.

(5) The mask blanks with the common light shielding pattern can be reused. In other words, the effective utilization of resources becomes possible.

(6) The quality management of the mask blanks in the photo mask manufacturing steps can be alleviated, and thus, the yield of the mask blanks can be greatly enhanced.

(7) Due to foregoing Items (5) and (6), the costs of the photo mask 1PA4 can be decreased, so that the costs of the semiconductor integrated circuit device can be decreased.

(8) The mask substrate 1a can be stocked during the steps of manufacturing the photo mask 1PA4, so that the length of time required for the manufacture and development of semiconductor integrated circuit devices can be greatly shortened.

Embodiment 4:

This embodiment 4 relates to an example of the case where a transparent thin-film pellicle which functions to prevent foreign matter from attaching to the photo mask pattern forming surface (first major surface) is disposed on the major surface of the photo mask. This Embodiment 4 is identical with the foregoing Embodiments 1 to 3 except for the above-mentioned point. Here, description will be made with reference to the use of the photo mask constituted in such a manner that a light shielding pattern comprising a metal film is provided in the vicinity of the outer periphery of the mask substrate as in case of the photo mask described, for example, in connection with the foregoing Embodiment 3.

Figure 15A:
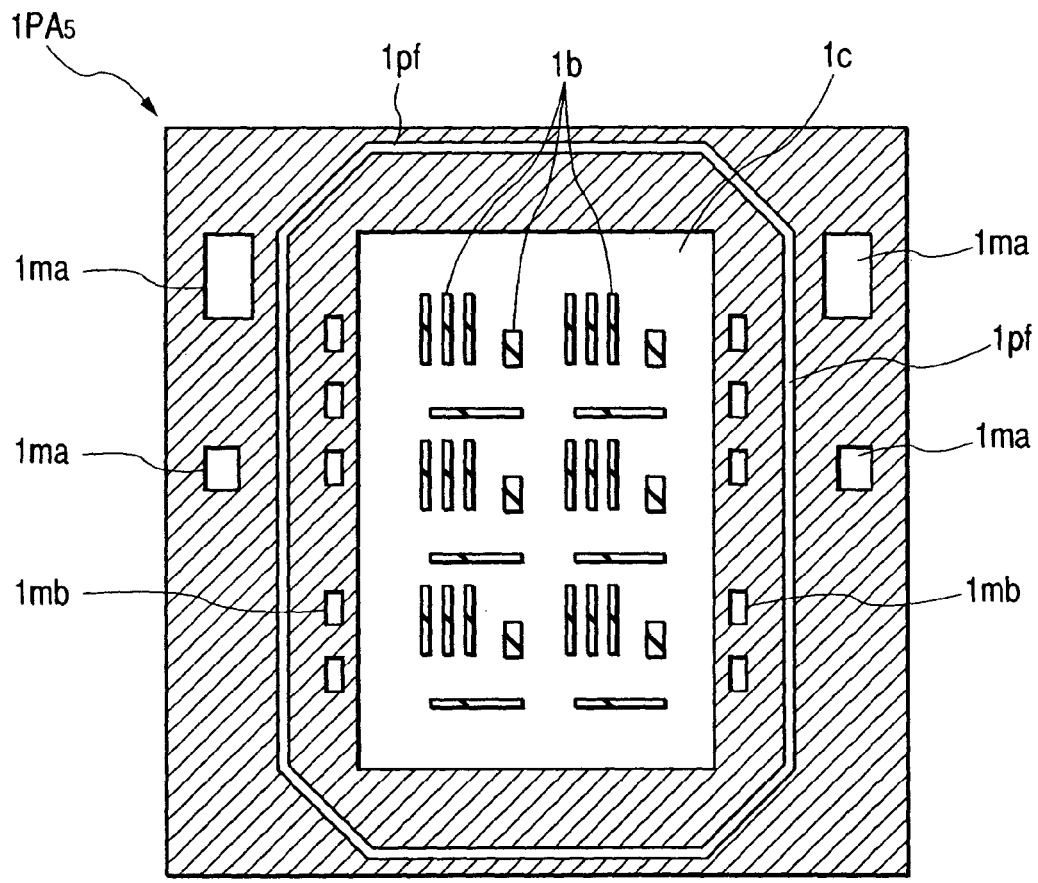
FIG. 15(a) is a plan view of the optical mask according to still another embodiment of the present invention.
Figure 15B:
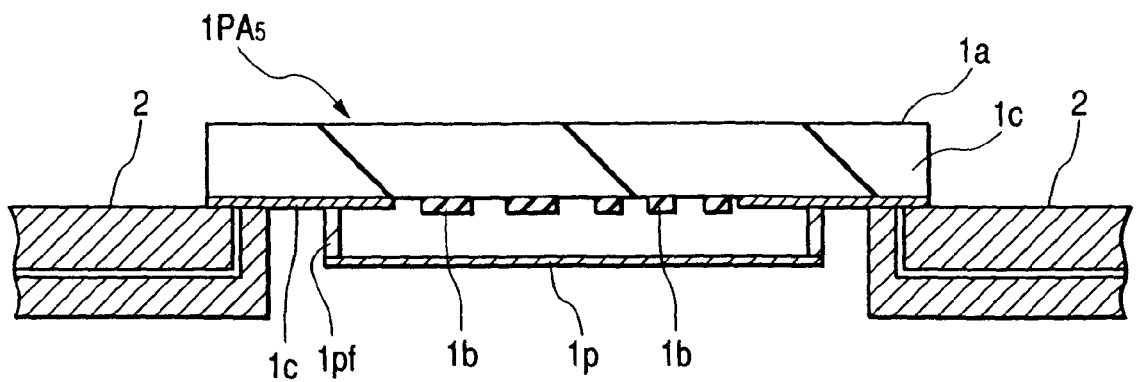
FIG. 15(b) is a sectional view of the essential part of the optical mask shown in FIG. 15(a), showing the state in which the optical mask is mounted on a predetermined apparatus.

FIGS. 15(a) and 15(b) show a concrete example of the photo mask according to this Embodiment 4. Here, FIG. 15(a) is a plan view of the photo mask, and FIG. 15(b) is a sectional view of the photo mask taken along the line A—A in FIG. 15(a) showing the state in which the photo mask is mounted on a predetermined apparatus.

According to this Embodiment 4, a pellicle 1p is fixed in a state joined through a pellicle sticking frame 1pf to a major surface (first major surface) of a photo mask 1PA5. The pellicle is a structural body which has a transparent film and is provided over a predetermined distance from the major surface or the major and back surfaces of the mask substrate, in order to avoid foreign matter from attaching to the photo mask. This predetermined distance is designed by taking into consideration the foreign matter attaching to the protective film surface and the transferability of the foreign matter onto the semiconductor wafer. In this Embodiment 4, the pellicle 1p is disposed in a pellicle cover region of a photo mask 1PA5. That is, the pellicle 1p is disposed so as to plane-wise overlap the whole of the above-mentioned integrated circuit pattern region of the photo mask 1PA5 and a portion of the light shielding pattern 1c of the above-mentioned inner peripheral region.

According to this Embodiment 4, the base portion of the pellicle sticking frame 1pf is joined and fixed in a state directly contacted with the light shielding pattern 1c in the above-mentioned inner peripheral region of the photo mask 1PA5. As a result, the pellicle sticking frame 1pf can be prevented from being peeled off. Further, if a resist film is formed at the position at which the pellicle sticking frame 1pf is mounted, then, when the pellicle 1p is mounted and removed, it becomes a cause for the peeling-off of the resist film and for the generation of foreign matter. In this Embodiment 4, the pellicle sticking frame 1pf is joined in a state directly contacted with the light shielding pattern 1c, so that the generation of such foreign matter can be prevented. Such an effect is obtained also by joining and fixing the pellicle stacking frame 1pf in a state directly contacted with the mask substrate 1a. Further, this Embodiment 4 is also constituted in such a manner that, as shown in FIG. 15(b), no resist film is formed in the portion in which the photo mask 1PA5 and the mounting portion 2 of the projection aligner are contacted. As a result, the occurrence of foreign matter due to the peeling-off and shaving-off of the resist film can likewise be prevented as in the cases of foregoing Embodiments 1 to 3.

Further, in this Embodiment 4, a position calibrating mark pattern 1mb is formed in the light shielding pattern 1c. This position calibrating mark pattern 1mb is a pattern for detecting the positional information of the photo mask 1 directly from the photo mask 1 itself when a predetermined pattern is written on the photo mask 1 by the use of the electron beam writer. According to this Embodiment 4, when a predetermined integrated circuit pattern is pattern-formed in the integrated circuit pattern region of the mask substrate by the use of the electron beam writer, the mask pattern 1mb in the mask substrate 1a is read out at a rate of one per several seconds, whereby pattern writing is carried out, correcting (adjusting) the position to be irradiated by the electron beam for writing the pattern during the pattern writing step. As a result, the pattern writing positional accuracy of the electron beam writer can be enhanced.

Figure 16:
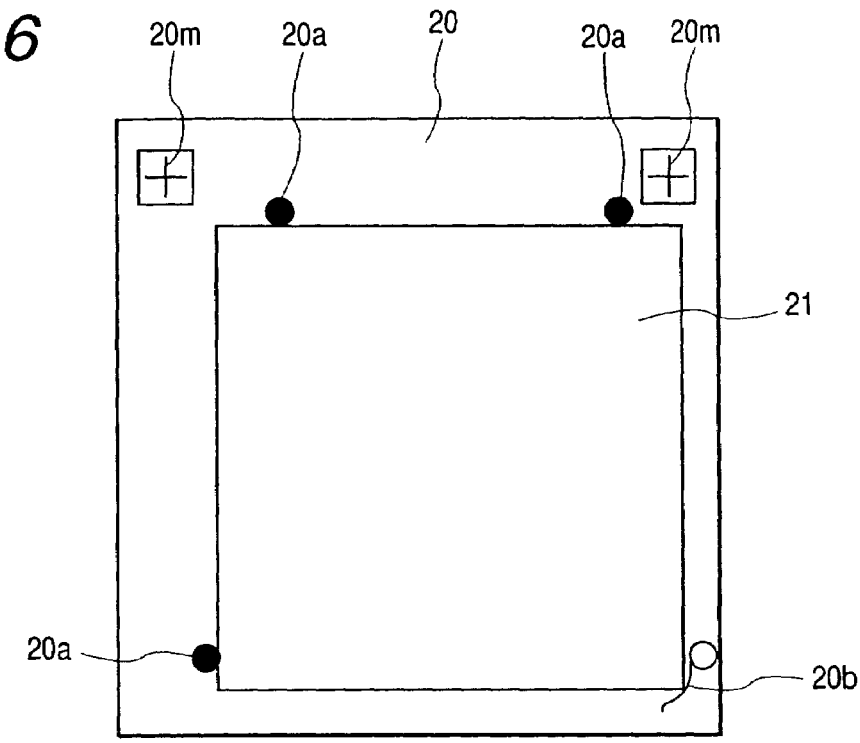
FIG. 16 is a diagram which shows the optical mask holding means when a predetermined pattern is written on an optical mask.

The provision of such a mark pattern 1mb is, for example, for the following reason: In case of an ordinary electron beam writer, the writing treatment to the photo mask is carried out in a vacuum. As for the holding of the photo mask in a vacuum, as symbolically shown in FIG. 16, the mask substrate 1a or a cassette 21 on which the mask substrate 1a is mounted is pushed to three pins 20a of a mask holding portion 20 on a moving stage of the electron beam writer; and thus, the mask substrate 1a or the cassette 21 is mechanically fixed by a push pin 20b. Here, in case of the ordinary electron beam writer, a position detecting mark pattern 20m mounted on the mask holding portion 20 is detected a plurality of times during the writing to thereby correct pattern writing the positional shift by the positional drift of the electron bean. The mask substrate 1a on the mask holding portion 20 (stage) is mechanically fixed as mentioned above, so that the relative positional relationship between the mark pattern 20m of the mask holding portion 20 and the mask substrate 1a should be constant, but, in actuality, due to the shocks caused by the stage which moves at high speed, a slight positional deviation is caused between the mark pattern 20m and the mask substrate 1a in some cases. Due to this, in spite of the fact that the position of the mask substrate 1a is read out from the mark pattern 20m during the electron beam writing step, a positional deviation is caused of the written pattern.

Thus, according to this Embodiment 4, the position correcting mark pattern 1mb is disposed on the photo mask 1PA5 (the mask substrate 1a) itself so that the position thereof can be directly detected from the mask substrate 1a itself. As a result, the positional deviation including also the deviation in the holding of the mask substrate 1a can be corrected, so that the error in arrangement of the patterns can be decreased. Such a mark pattern 1mb is constituted depending on, e.g., whether the pattern position lies in the light transmitting region or in the light screening region; and information detection is executed in accordance with the reflected state of a position detecting beam or a detection light irradiated there. As the position detecting means, there can be used the type which uses the electron beam of the electron beam writer, the type which uses the laser beam by a laser writer or other types. Particularly, the application of a system or apparatus having a high positional accuracy is desirable. This mark pattern 1mb can also be formed at the step of forming the common light shielding pattern in the above-mentioned photo mask manufacture, and it is also effective to form this mark pattern 1mb at the above-mentioned mask blanks manufacturing step.

According to such Embodiment 4, the following effects can be obtained in addition to the effects obtained by foregoing Embodiment 3:

(1) Since the pellicle 1p is provided on the photo mask 1PA5, it is possible to prevent foreign matter from attaching to the photo mask 1PA5, and it is also possible to suppress or prevent the deterioration of the transferred pattern due to the foreign matter.

(2) Since the pellicle sticking frame 1p1 is joined in a state directly contacted with the light shielding pattern 1c or the mask substrate 1a, it is possible to prevent the light-screening-pattern forming resist film from being peeled off or shaved off when the pellicle 1p is mounted or removed. Due to this, it is possible to prevent the occurrence of foreign matter due to the peeling-off or shaving-off of the resist film.

(3) Since the electron beam writing position correcting mark pattern 1mb is provided on the photo mask 1PA5 itself, it becomes possible to enhance the positional accuracy in the pattern writing by the electron beam writer.

Embodiment 5:

This Embodiment 5 relates to the case where the present invention is applied to a so-called phase shift mask which causes a difference between the phases of the exposure light rays transmitting through the photo mask.

This Embodiment 5 is identical with the foregoing Embodiments 1 to 4 except for the above-mentioned point.

Figure 17A:
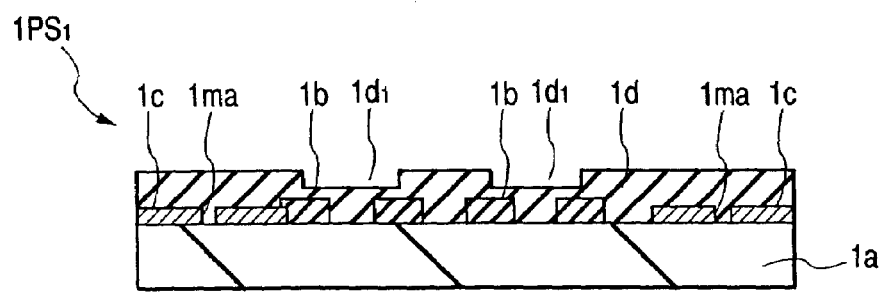
FIG. 17(a) is a sectional view of the essential part of the optical mask according to still another embodiment of the invention.
Figure 17B:
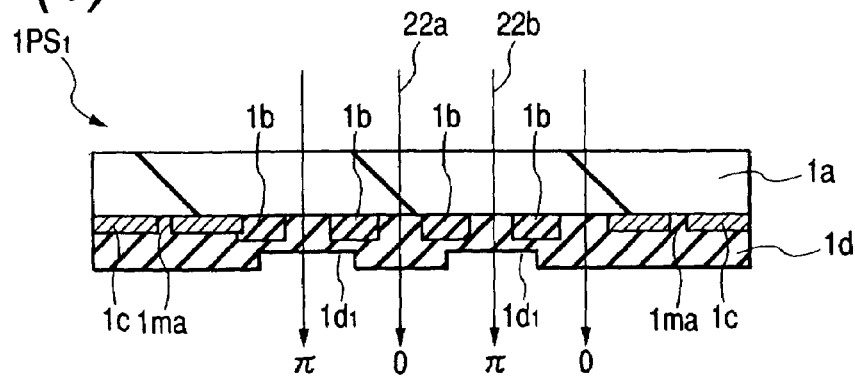
FIG. 17(b) is a sectional view of the essential part of the optical mask, showing the state in which, when exposure treatment is carried out, the exposure light rays which have transmitted through the respective portions of the optical mask shown in FIG. 17(a) are phase-inverted.

FIG. 17(a) shows a sectional view of the essential part of the phase shift mask on a major surface (first major surface) of a mask substrate 1a constituting a phase shift mask 1PS1, a phase shift film 1d is formed so as to cover light shielding patterns 1b, 1c and the mask substrate 1a. The phase shift film 1d may comprise, for example, a transparent SOG (Spin On Glass) film (Either an organic SOG film or an inorganic SOG film may be used. In case of an organic SOG film, however, the exposure light is absorbed, so that an optimum film thickness must be set. From the optical viewpoint, the use of an inorganic SOG film is preferable), and, at a predetermined position of the phase shift film 1d, a groove 1d1 with a predetermined depth is formed. The depth of this groove 1d1 is set to such a depth that the phase of the exposure light which has transmitted through the region in which the groove 1d is formed and the phase of the exposure light which has transmitted through the region in which the groove 1d1 is not formed are inverted with respect to each other. FIG. 17(b) shows the state in which the exposure light rays 22a, 22b irradiated from the back surface (second major surface) side of the mask substrate 1a of the phase shift mask 1PS1 are phase-inverted with respect to each other. The exposure light 22a passes through the relatively thick portion of the phase shift film 1d. On the other hand, the exposure light 22b passes through the portion in which the groove 1d1 is dug to such a depth that the phase of the exposure light 22b is inverted with respect to the phase of the exposure light 22a, so that the exposure light 22b is inverted in phase with respect to the exposure light 22a. More specifically, a phase difference of, e.g., 1800 is caused. As a result, in the mutually adjacent transmitting portions, a phase shift effect is obtained; and thus, the resolution of the pattern transferred onto the semiconductor wafer can be enhanced.

Further, in the phase shift mask 1PS1 according to this Embodiment 5, the phase shift film 1d covers the whole surface of the major surface of the mask substrate 1a. Thus, in case the phase shift mask 1PS1 is mounted on an inspection equipment or an aligner, the phase shift film 1d of the phase shift mask 1PS1 comes into contact with the mounting portion of the inspection equipment or the aligner. Accordingly, as in the cases of the foregoing Embodiments 1 to 4, the mounting portion of the inspection equipment or the aligner is not directly contacted with the patterns (the light shielding pattern 1b, etc.) constituted of a resist film on the mask substrate 1a, so that the peeling-off or the shaving-off of the resist film due to the mounting of the phase shift mask 1PS1 can be prevented, and the occurrence of foreign matter due to the above-mentioned peeling-off or shaving-ff can be prevented.

Figure 18A:
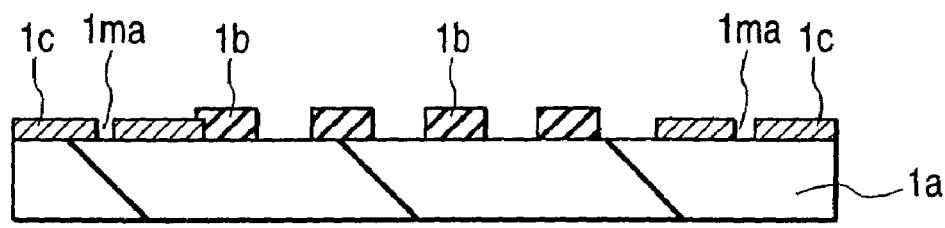
FIG. 18(a) to FIG. 18(c) are sectional views of the essential part during manufacturing steps for the manufacture of the optical mask shown in FIG. 17(a).

Next, an example of the method for the manufacture of the phase shift mask 1PS1 according to this Embodiment 5 will be described. First, as shown in FIG. 18(a), the above-mentioned light shielding pattern 1b constituted of a resist film and the light shielding pattern 1c constituted of a metal film are formed on the mask substrate 1a in the same manner as in the cases of foregoing Embodiments 3, 4.

Figure 18B:
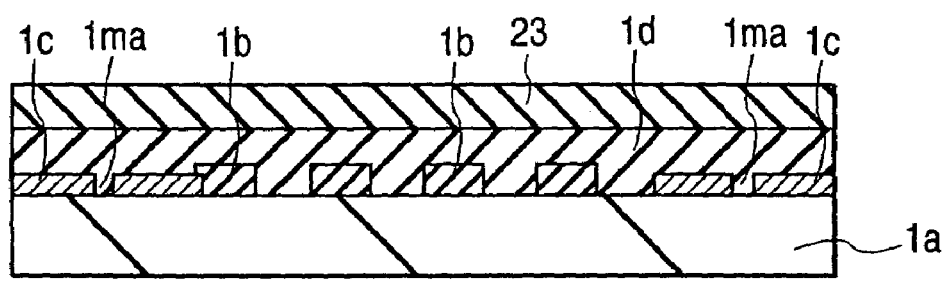
Figure 18C:
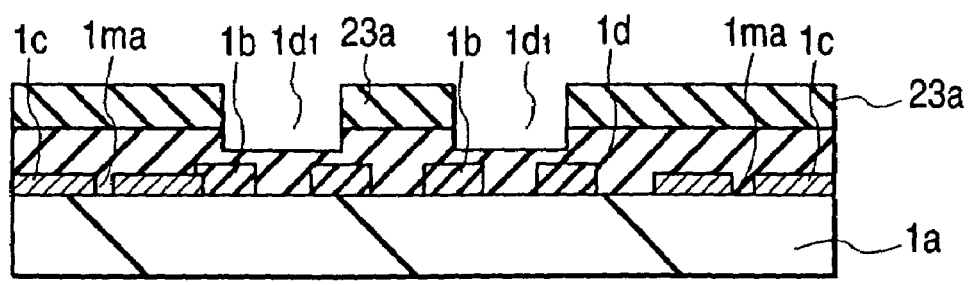

Subsequently, as shown in FIG. 18(b), on a major surface (the first major surface) of the mask substrate 1a, the phase shift 1d comprising, e.g., an SOG film is deposited, and then, an electron beam resist film 23 is deposited on the thus deposited phase shift film 1d. After this, on this electron beam resist film 23, a desired pattern is written by an electron beam writing treatment, and then, as shown in FIG. 18(c), a resist pattern 23a constituted of the electron beam resist film is formed via an ordinary step.

Here, also, the above-mentioned static electrification preventing treatment was adopted. After this, by the use of the resist pattern 23a as an etching mask, the phase shift film 1d exposed from the resist pattern 23a was removed by etching to form the groove 1d1. Thereafter, the resist pattern 23a was removed, whereby the phase shift mask 1PS1 shown in FIG. 17(a) was obtained.

According to such Embodiment 5, it is possible to obtain, for example, the effect that the resolution of the patterns transferred onto the semiconductor wafer, in addition to the effects obtained by foregoing Embodiment 3.

Embodiment 6:

This Embodiment 6 relates to a modification of the phase shift mask according to foregoing Embodiment 5. Except for this point, Embodiment 6 is identical with foregoing Embodiments 1 to 5.

Figure 19A:
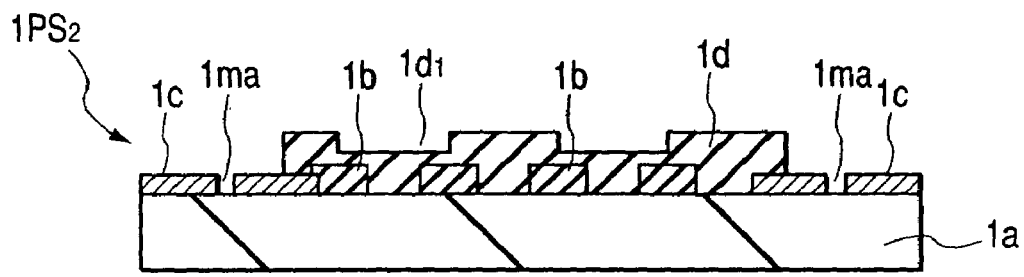
FIG. 19(a) is a sectional view of the essential part of the optical mask according to still another embodiment of the invention.
Figure 19B:
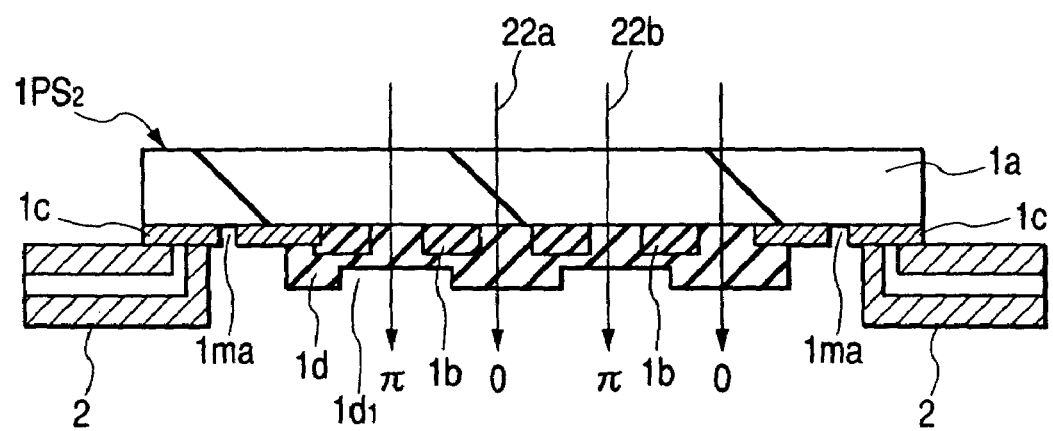
FIG. 19(b) is a sectional view of the essential part of the optical mask shown in FIG. 19(a), showing the state in which the exposure eight rays which have transmitted through the respective portions of the optical mask are phase-inverted.

In this Embodiment 6, the phase shift film 1d is removed in the above-mentioned outer peripheral region of the mask substrate 1a constituting the phase shift mask 1PS2, and thus, the light shielding pattern 1c is exposed, as shown in FIG. 19(a). FIG. 19(b) shows the state in which this phase shift mask 1PS2 is mounted on the aligner or the like, symbolically depicting how the phase inversion between the exposure light rays 22a, 22b is effected when the exposure light rays are irradiated from the back surface side (the second major surface) of the phase shift mask 1PS2, wherein the mounting portion 2 is directly contacted with the light shielding pattern 1c of the photo mask 1PS2. Therefore, in case of this Embodiment 6, the same effects as those of foregoing Embodiments 1 to 5 can be likewise obtained. The manufacture of this phase shift mask 1PS2 can be achieved in such a manner that, after or before the step shown in FIG. 18(b), a resist pattern is formed so as to expose the outer peripheral region of the outer periphery of the major surface of the mask substrate 1a is exposed and yet cover the portions other than the above-mentioned outer peripheral region, and then, this resist pattern is used as an etching mask to etched off the phase shift film id exposed therefrom.

Embodiment 7:

This Embodiment 7 relates to the case where the present invention is applied to a semitransparent shift mask (the above-mentioned halftone mask). Except for this point, this Embodiment 7 is identical with foregoing Embodiments 1 to 6.

Figure 20A:
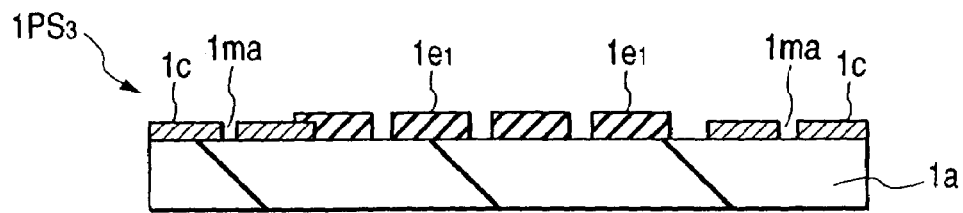
FIG. 20(a) is a sectional view of the essential part of the optical mask according to still another embodiment of the invention.
Figure 20B:
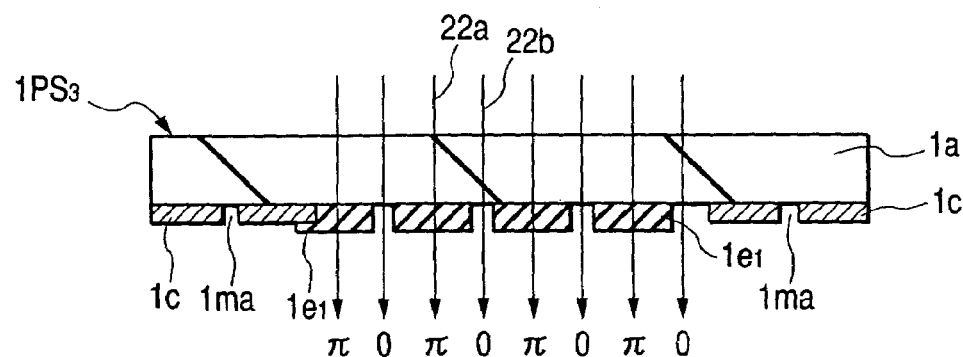
FIG. 20(b) is a sectional view of the essential part of the optical mask shown in FIG. 20(a), showing the state in which the exposure light rays which have transmitted through the respective portions of the optical mask are phase-inverted.

FIG. 20(a) shows an example of the halftone type phase shift mask 1PS3 according to this Embodiment 7. In the integrated circuit pattern region of this phase shift mask 1PS3, a halftone pattern (halftone light shielding pattern) 1e1 for transferring the semiconductor integrated circuit pattern is formed. This halftone pattern 1e1 is constituted of a resist film which has been described in connection with the foregoing Embodiment 1, etc., but this halftone pattern 1e1 is semitransparent with respect to the exposure light, and the film thickness thereof is adjusted to the value which inverts the phase of the exposure light. FIG. 20(b) shows how the phase inversion of the exposure light rays 22a, 22b which have been irradiated from the back surface (second major surface) side of the phase shift mask 1PS3 according to this Embodiment 7 is effected. The exposure light 22a which has passed through the halftone pattern 1e1 is inverted in phase with respect to the exposure light 22b which has passed through the transparent portion. In other words, the phases of these exposure light rays 22a, 22b deviate by 180° from each other. Further, the transmissivity of the halftone pattern 1e1 is such that the light intensity of the exposure light 22a which has transmitted through the halftone pattern 1e1 is about 2 to 10% with respect to the exposure light 22a before its transmission through the halftone pattern 1e1. Therefore, the halftone pattern 1e1 serves substantially as a light screening portion and yet has the effect of making the boundary portion of the transferred patterns clear and sharp. The method of patterning the halftone pattern 1e1 is the same as the patterning method of the light shielding pattern 1b according to the foregoing Embodiments 1 to 6.

In case of the phase shift mask for ArF, the absorption of the resist film constituting the mask is large, so that, in order to realize both the transmissivity of about 2 to 10% as mentioned above and phase inversion at the same time, adjustment must be made of the resist film for forming the halftone pattern 1e1. on the other hand, in case of the phase shift mask for an $F_2$ laser beam with a wavelength of 163 nm, the absorption by the resist film is small, so that this phase shift mask is favorable in realizing the above-mentioned transmissivity of about 2 to 10% and phase inversion at the same time.

By such Embodiment 7, the effects obtained by the foregoing Embodiments 1 to 6 can also be obtained.

Embodiment 8:

This Embodiment 8 relates to a modification of the halftone type phase shift mask according to the foregoing Embodiment 7. Except for this point, the Embodiment 8 is identical with the foregoing Embodiments 1 to 7.

In this Embodiment 8, the phase difference is set depending on the film thickness of the halftone pattern, so that it is necessary to bring the thickness into a predetermined range. Due to this, it becomes difficult to set the intensity of the light passing through the halftone pattern in some cases.

Thus, according to this Embodiment 8, the above-mentioned phase difference is not set only by the film thickness of the halftone pattern, but the phase difference is set by adjusting the film thickness and the depth of grooves dug in the mask substrate (that is, the thickness of the mask substrate in the groove-formed portions). As a result, according to this Embodiment 8, the effect that the intensity setting of the light which transmits through the halftone pattern can be facilitated, is obtained in addition to the effects obtained by foregoing Embodiments 1 to 7. Further, the range of materials for forming the halftone pattern can be increased.

Figure 21A:
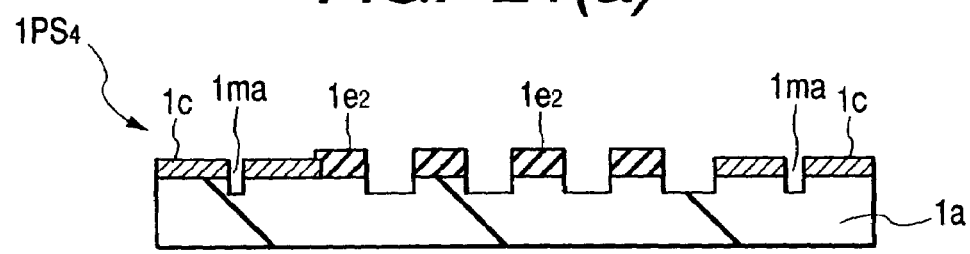
FIG. 21(a) is a sectional view of the essential part of the optical mask according to still another embodiment of the invention.

FIG. 21(a) shows a concrete example of the halftone type phase shift mask 1PS4. In this halftone type phase shift mask 1PS4, the halftone pattern 1e2 was rendered into a thin film and semitransparent and thus, phase inversion was realized by the thickness of the halftone pattern 1e2 and the thickness of the mask substrate 1a in the portions of the grooves 1g formed in the mask substrate 1a. The halftone pattern 1e2 was formed by the use of a novolac series resin with a thickness of, e.g., about 50 nm. As a result, the transmissivity of the halftone pattern 1e2 became 5%. However, this transmissivity limited to 5% but can be variously altered; in a range of, e.g., about 2 to 20%, selection satisfying the purpose can be made. The phase inversion in this case was about 90°. Due to this, grooves if with a depth of about 90 nm were dug in the mask substrate 1a so that the exposure light which has transmitted through the photo mask 1PS4 could obtain a phase inversion of about 180° in total. The film thickness of the halftone pattern 1e2 is not limited to this value but can be variously altered; the film thickness may be adjusted so that the phase may be inverted in accordance with the refractive index of the material, the exposure light wavelength, etc.

Figure 21B:
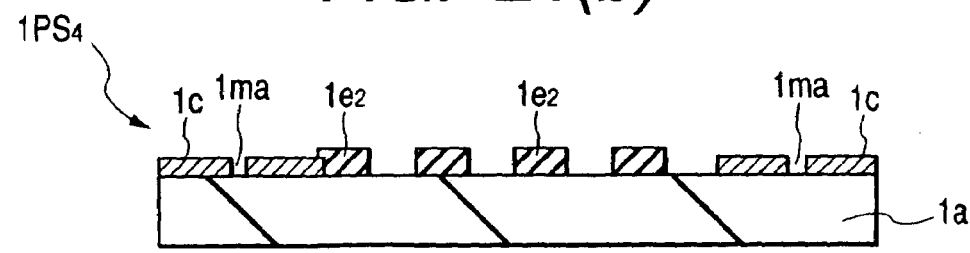
FIG. 21(b) is a sectional view of the essential part during a manufacturing step for the manufacture of the optical mask shown in FIG. 21(a).

This phase shift mask 1PS4 is formed in the following manner for example: First, as in case of the foregoing Embodiment 7, etc., the light shielding pattern 1c and the halftone pattern 1e2 are formed on the mask substrate 1a as shown in FIG. 21(b), and thereafter, by the use as etching mask of the light shielding pattern 1c and the halftone pattern 1e2, the portions of the mask substrate 1a which are exposed from there are selectively etched off by an amount corresponding to a predetermined depth. By so doing, the grooves if shown in FIG. 21(a) are formed in a self-aligning manner with respect to the halftone pattern 1e2, and thus, the photo mask 1PS4 is manufactured. According to this Embodiment 8, the halftone type phase shift mask 1PS4 with a transmissivity of, e.g., 5% could be manufactured. In case of the example shown in FIG. 21(a), the portion of the mask substrate 1a which lies in the mark pattern 1ma region is also removed by etching and dug in at the time of forming the grooves if, in order to simplify the mask manufacturing step, but it is also possible not to remove by etching the portion of the mask substrate 1a lying in this region.

Embodiment 9:

This Embodiment 9 relates to a modification of the halftone type phase shift mask according to the foregoing Embodiments 7, 8. In this Embodiment 9, in order to give a solution to the problem described in connection with foregoing Embodiment 8, the phase of the above-mentioned exposure light is adjusted not only by the halftone pattern but by providing a different film which plane-wise overlaps the halftone pattern. By this measure, according to Embodiment 9, the effect that the intensity setting of the light transmitting through the halftone pattern can be facilitated as in case of foregoing Embodiment 8, can be obtained, in addition to the effects obtained by the foregoing Embodiments I to 7. Further, the range of materials for forming the halftone pattern can be increased.

Figure 22A:
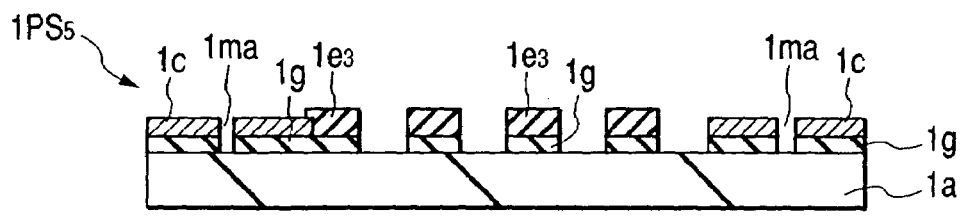
FIG. 22(a) is a sectional of the essential part of the optical mask according to still another embodiment of the invention.

FIG. 22(a) shows a concrete example of the halftone type phase shift mask according to Embodiment 9. In this halftone type phase shift mask 1PS5, between a halftone pattern 1e3 similar to that of foregoing Embodiment 8 and a mask substrate 1a, a transparent phase adjusting film 1g comprising, e.g., a silicon oxide film is provided, so that, by adjusting the film thickness of the halftone pattern 1e3 and the film thickness of the phase adjusting film 1g, the above-mentioned phase inversion is realized.

Figure 22B:
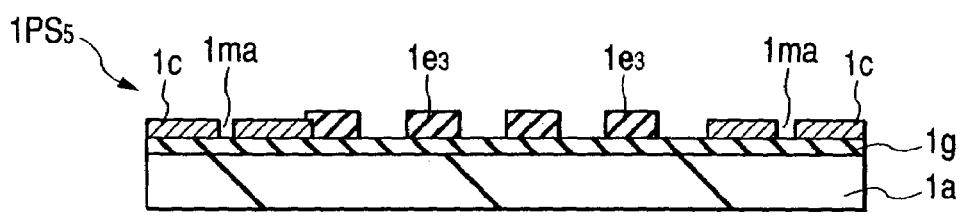
FIG. 22(b) is a sectional view of the essential part during a manufacturing step for the manufacture of the optical mask shown in FIG. 22(b).

This phase shift mask 1PS5 is formed, for example, in the following manner: First, as shown in FIG. 22(b), on a major surface (first major surface) of the mask substrate 1a, the phase adjusting film 1g comprising, e.g., a silicon oxide film is formed by the sputtering method, the CVD method (Chemical Vapor Deposition) method or the coating method, and thereafter, on the phase adjusting film 1g thus formed; a light shielding pattern 1c and the halftone pattern 1e3 are formed as in the cases of the foregoing Embodiments 7, 8, etc. Subsequently, only with the above-mentioned halftone pattern 1e3, the phase inversion obtained was about 90°, so that the phase adjusting film 1g lying beneath the halftone pattern 1e3 and the light shielding pattern 1c was dug by, e.g., about 90 nm by the use of the halftone pattern 1e3 and the light shielding pattern 1c as an etching mask, whereby a phase inversion of about 180° in total was obtained. In this way, the halftone mask 1PS5 shown in FIG. 22(a) is manufactured. According to this Embodiment 9, likewise, a halftone type phase shift mask 1PS5 with a transmissivity of, e.g., 5% could be manufactured. The film thickness of the halftone pattern 1e3 is not limited to this value as in case of foregoing Embodiment 8. Further, also in this Embodiment 9, in order to simplify the mask manufacturing step, the phase adjusting film 1g portion in the mark pattern 1ma region is also removed by etching at the time of patterning the phase adjusting film 1g, but it is also possible not to etch off the portion of the phase adjusting film 1g which lies in this region.

Embodiment 10:

This Embodiment 10 relates to a modification of the halftone type phase shift mask according to the foregoing Embodiments 7, 8, 9 and a modification of the method for the manufacture of the above-mentioned halftone type phase shift mask. Except for the above-mentioned point, this Embodiment 9 is identical with the foregoing Embodiments 1 to 9.

This Embodiment 10, likewise, provides the constitution for giving a solution to the problem described in connection with the foregoing Embodiment 8. As a result, this Embodiment 10 can obtain the effect that the intensity setting of the light which transmits through the halftone pattern can be facilitated, as is obtained in the cases of the foregoing Embodiments 8, 9, in addition to the effects obtained by the foregoing Embodiments 1 to 7. Further, the range of materials selected for forming the halftone pattern can be increased.

An example of the method of manufacture of the halftone type phase shift mask according to this Embodiment 10 will now be described with reference to FIG. 23.

Figure 23A:
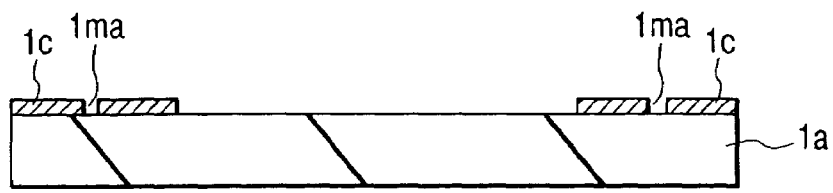
FIG. 23(a) to FIG. 23(d) are sectional views of the essential part during manufacturing steps for the manufacture of the optical mask according to still another embodiment of the invention.
Figure 23B:
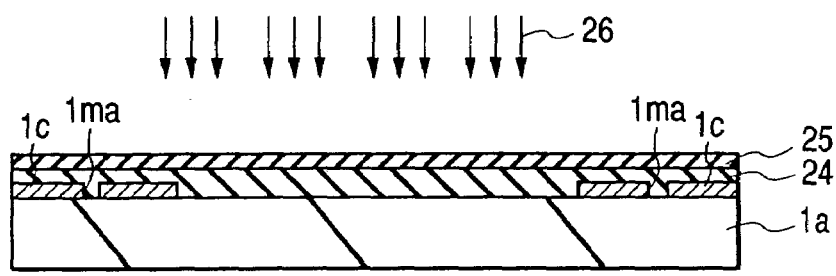
Figure 23C:
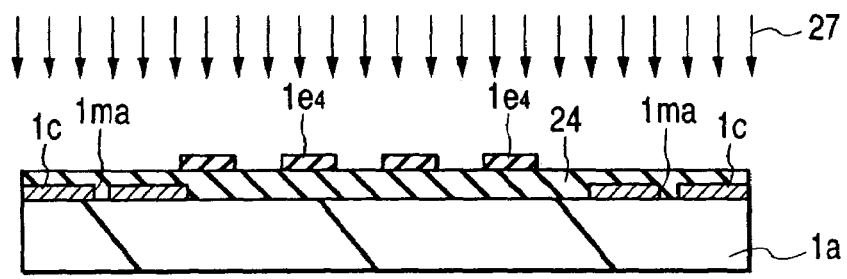

First, as shown in FIG. 23(a), on a major surface (first major surface) of a mask substrate 1a, a light shielding pattern 1c and a mark pattern 1ma as mentioned above are formed as in the cases of the foregoing Embodiments 1 to 9. In other words, the above-mentioned common light shielding pattern forming step is carried out. Subsequently, as shown in FIG. 23(b), on the major surface of the mask substrate 1a, a resist mask 24 which is transparent to the exposure light is formed by coating so as to cover the above-mentioned light shielding pattern 1c and the above-mentioned mask substrate 1a, and further, on the thus provided resist film 24, a resist film 25 with light screening properties as used in the foregoing Embodiment 7 was formed of a thin film and made semitransparent. Here, as the transparent resist film 24, a PGMA 24 (polyglycidyl methacrylate) or the like which is, e.g., of the positive type was used. Further, the resist film 25 with light screening properties was formed by the use of a novolac series resin which has a thickness of about 50 nm and is, e.g., of the negative type. After this, on the resist film 25, a desired integrated circuit pattern was written by the use of an electron beam 26 or the like. Here, also, a static electrification preventing treatment was conducted. After this, an ordinary developing treatment was conducted to develop the resist film 25, whereby a halftone pattern 1e4 is formed as shown in FIG. 23(c).

Figure 23D:
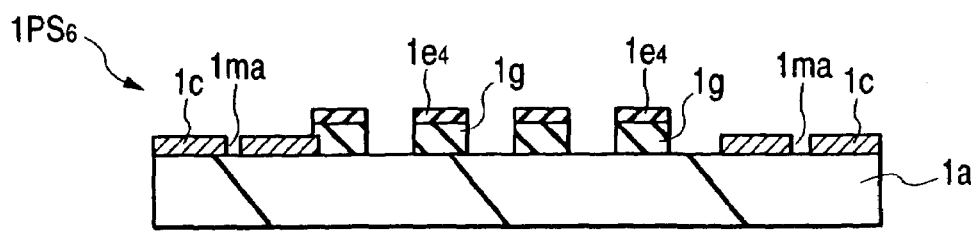

Subsequently, the major surface of the mask substrate 1a was subjected to an ordinary exposure treatment to expose the portion of the resist film 24 which is exposed from the halftone pattern 1e4 having light screening properties, and thereafter, a developing treatment is performed whereby, as shown in FIG. 23(d), beneath the halftone pattern 1e4, a phase adjusting film 1g constituted of the resist film 24 and in a self-alinging manner with respect to the halftone pattern 1e4 so as to plane-wise overlap the halftone pattern 1e4. In this way, a phase shift mask 1PS6 was manufactured. In the structure of this phase shift mask 1PS6, the phase adjusting film 1g is provided only beneath the halftone pattern 1e4. The phase adjustment of the exposure light which transmits through the phase shift mask 1PS6 is made through the film thickness of the halftone pattern 1e4 and the film thickness of the phase adjusting film 1g. As a result, phase inversion could be realized between the light which has transmitted through the stacked pattern region consisting of the halftone pattern 1e4 and the phase adjusting film 1g and the light which has transmitted through the mask substrate 1a. Further, the transmissivity of the stacked pattern region turned out to be about 5%. Thus, the halftone type phase shift mask 1PS6 with a transmissivity of about 5% could be fabricated as in the cases of the foregoing Embodiments 8, 9, etc.

Embodiment 11:

This Embodiment 11 relates to a modification of the foregoing Embodiment 1.

Through the result of the examination made by the present inventor, the following has been found: It is also effective that, on the major surface of the mask substrate, the light shielding pattern for forming the integrated circuit pattern and the mark pattern is formed of the above-mentioned resist film, and thereafter, on the above-mentioned major surface, a transparent protective film is formed so as to cover the light shielding pattern. By this measure, the mechanical strength of the light shielding pattern formed of the above-mentioned resist film can be enhanced. Further, by shutting off the oxygen by the protective film, the change in the film quality of the light shielding pattern formed of the resist film can be prevented.

Figure 24A:
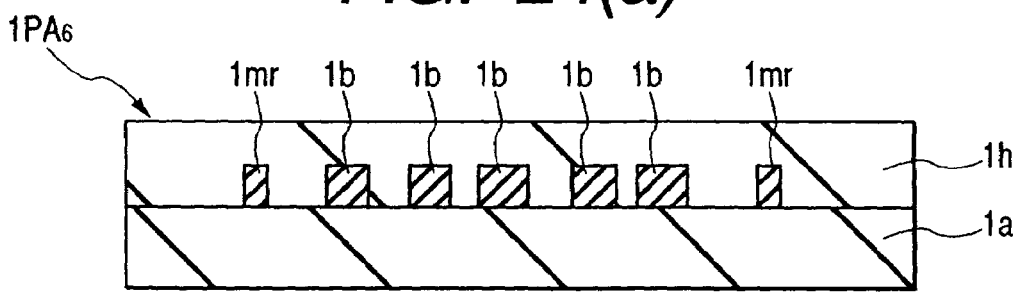
FIG. 24(a) is a sectional view of the essential part of the optical mask according to still another embodiment.
Figure 24B:
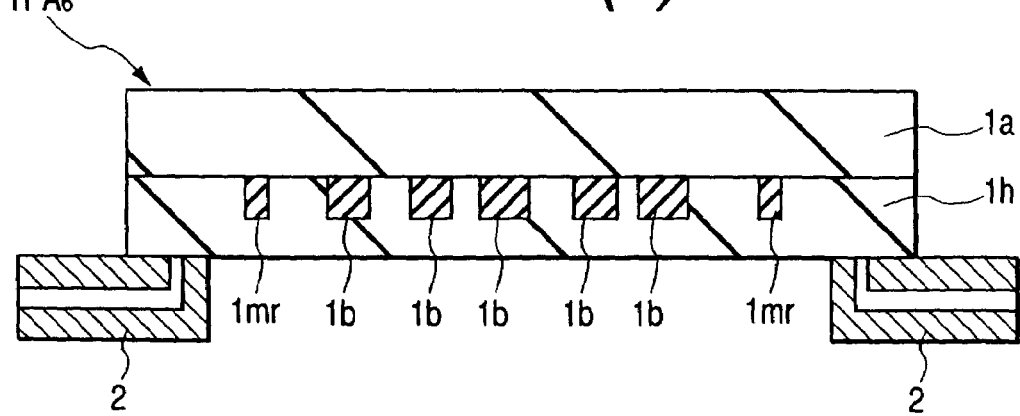
FIG. 24(b) is a sectional view of the essential part of the optical mask shown in FIG. 24(a), showing the state in which the optical mask is mounted onto a predetermined apparatus.

FIG. 24(a) shows a concrete example of this Embodiment 11. Over the whole of a major surface (first major surface) of a mask substrate $1a$ constituting the photo mask 1PA6, a protective film $1h$ comprising, e.g., a silicon oxide film or a silicon compound coating is provided. In case the protective film $1h$ was comprised of a silicon oxide film or the like, the protective film $1h$ was formed by, e.g., the sputtering method or the CVD method. Further, in case the protective film $1h$ was comprised of a silicon compound coating, it was subjected to heat treatment at about 100 to 200° C. after the coating thereof.

Further, in the photo mask 1PA6 according to this Embodiment 11, the protective film $1h$ covers the whole major surface of the mask substrate $1a$. Thus, in case of mounting the photo mask 1PA6 on inspection equipment, an aligner or the like, the protective film $1h$ of the photo mask 1PA6 is contacted with the mounting portion of the inspection equipment, the aligner or the like. Therefore, as in the cases of the foregoing Embodiments 1 to 9, the mounting portion of the inspection equipment, the aligner or the like is not directly contacted with the pattern (the light shielding pattern $1b$, etc.) constituted of a resist film on the mask substrate $1a$, so that the peeling-off or shaving-off of the resist film due to the above-mentioned mounting can be prevented, and the occurrence of foreign matter due to the peeling-off or shaving-off can also be prevented. This structure can be also applied to the photo masks according to the foregoing Embodiments 2 to 4.

In the above, the invention achieved by the present inventor has been concretely described on the basis of its embodiments, but it is a matter of course that the invention is not limited to the foregoing embodiments, but can be variously modified without departure from the gist of the invention.

For example, the foregoing Embodiments 1 to 10 have been described with reference to the case where the wiring is of the ordinary wiring structure, but the invention is not limited to this, but the wiring may alternatively be formed by, e.g., the so-called damascene method or the duel damascene method according to which a wiring is formed in an insulator film or a wiring is formed by burying a conductor film into a groove for a hole.

Further, the foregoing Embodiments 1 to 10 have been described with reference to the case where a semiconductor substrate comprising an elemental semiconductor is used, but the invention is not limited to such case. Thus, for example, an SOI (Silicon On Insulator) substrate constituted by providing a thin semiconductor layer on an insulator layer, or an epitaxial layer provided on a semiconductor substrate, may be used.

In case the mark pattern is formed of a resist film in the foregoing Embodiments 1, 11, an absorbing material which absorbs the mark detecting light (such as, e.g., the probe light of a defect inspection equipment (the probe light being light which has a wavelength, of, e.g., 500 nm, greater than the exposure wavelength)) may be added to the resist film.

In the above, the invention achieved by the present inventor has been described, mainly, with reference to the case where the invention is applied to a method for the manufacture of a semiconductor integrated circuit device with a CMIS circuit which belongs to the field of utilization constituting the background of the invention, but the invention is not limited to this, but can also be applied to a semiconductor integrated circuit device with a memory circuit, such as, e.g., a DRAM (Dynamic Random Access Memory), an SRAM (Static Random Access Memory) or a flash memory (EEPROM; Electric Erasable Read Only Electric Erasable Read Only Memory) or the like, a semiconductor integrated circuit device with a logic circuit, such as, e.g., a microprocessor or the like, or a mixed-discrete-components-loaded type semiconductor circuit device in which the above-mentioned memory circuit and logic circuit are provided on one and the same semiconductor substrate.

Further, the technical concept of the present invention is not limited to the application to a method of manufacturing semiconductor integrated circuit devices, but can also be applied to a method of manufacturing other electronic devices (electronic circuit devices) etc. such as, e.g., a liquid crystal substrate and a magnetic head.

Further, the pellicle is stuck or bonded to the mask substrate in the portion provided with no resist, whereby a good fixing characteristic is provided. In particular, in case the pellicle is contact-fixed on a chromium (metal) screening film in the periphery of the mask, a particularly excellent fixing characteristic is exhibited.

Further, the fixing of the pellicle to the mask holder of the mask is made in such a manner that the pellicle is contact-fixed onto that portion of the mask periphery which has no resist film, that is, onto the surface of a quartz mask substrate, a screening metal portion such as, e.g., chrominum or a metal compound film portion; and thus, a good fixing characteristic followed by no shift or deviation is exhibited.

The effects achieved by the typical aspects of the invention disclosed in the present application will be briefly described below.

(1) According to the present invention, in the periphery of the optical mask, any of various patterns comprising a resist film are not provided in the region with which the mounting portion of the inspection equipment, the aligner or the like is contacted, whereby the occurrence of foreign matter due to the peeling-off or shaving-off of the resist film on the optical mask due to the mechanical shocks caused when the optical mask is mounted on the inspection equipment, the aligner or the like, can be suppressed or prevented.

(2) Due to the foregoing Item (1), the deterioration of the detecting accuracy due to the peeling-off or shaving-off of the resist film on the photo mask and the deterioration in the transfer accuracy of the exposure pattern can be prevented.

(3) Due to the foregoing Item (1), it becomes possible to prevent the short-circuit defects, open-circuit defects, etc. between the patterns on the semiconductor wafer due to the peeling-off or shaving-off of the resist film on the photo mask.

(4) Since a light screening metal region is provided in the outer periphery of the mask substrate of the optical mask, and, by removing a portion of this light screening metal region, a mark pattern for detecting the information of the optical mask is formed, the ability of detecting the information of the optical mask can be enhanced.

(5) Due to the foregoing Item (4), the detecting accuracy of the calibrating mark on the optical mask can be enhanced in case of inspecting the optical mask, so that the inspecting accuracy of the optical mask can be enhanced. Therefore, the reliability of the optical mask can be enhanced.

(6) Due to the foregoing Item (4), the accuracy in the alignment between the optical mask and the aligner can be enhanced. Accordingly, the transfer accuracy of the patterns transferred onto the semiconductor wafer and the alignment accuracy can be enhanced.

(7) Due to the foregoing Items (1) to (6), the reliability of the semiconductor integrated circuit devices manufactured by the use of the optical mask according to the present invention can be enhanced.

(8) Due to the foregoing Items (1) to (6), the yield of the semiconductor integrated circuit devices manufactured by the use of the optical mask according to the present invention can be enhanced:

What is claimed is:

1. A method of manufacturing a semiconductor integrated circuit device, comprising: (a) the step of irradiating far ultraviolet or vacuum ultraviolet exposure light from a second major surface side of a mask substrate, said mask substrate having on a first major surface thereof a light shielding pattern which is an integrated circuit pattern on a mask and comprises a resist pattern including an organic film; and (b) the step of reduction-projecting, by a projection optical system, said exposure light which has transmitted through said mask substrate, whereby said integrated circuit pattern is imaged on a photo resist film formed on a first major surface of a semiconductor integrated circuit wafer and thus transferred.

2. The method of manufacturing a semiconductor integrated circuit device according to claim 1, wherein the wavelength of said exposure light is at least 100 nm but less than 250 nm.

3. The method of manufacturing a semiconductor integrated circuit device according to claim 2, wherein said wavelength of said exposure light is at least 100 nm but less than 200 nm.

4. The method of manufacturing a semiconductor integrated circuit device according to claim 3, wherein, in the peripheral portion of the first major surface of said mask substrate, a light screening metal region is provided.

5. The method of manufacturing a semiconductor integrated circuit device according to claim 4, wherein, on the first major surface of said mask substrate, a pellicle is provided so as to cover said integrated circuit pattern, said pellicle being contact fixed on said light screening metal region.

6. A method of manufacturing a semiconductor integrated circuit device, comprising:
(a) the step of irradiating far ultraviolet or vacuum ultraviolet exposure light from a first major surface or a second major surface side of said mask substrate in the state in which the peripheral region of said mask substrate is held on a mask holding mechanism, said mask substrate having on the first major surface thereof a light shielding pattern which is an integrated circuit pattern on a mask and comprises a resist pattern including an organic film, said resist pattern being not provided on said peripheral region; and
(b) the step of reduction-projecting, by a projection optical system, said exposure light which has transmitted through said mask substrate, whereby said integrated circuit pattern is imaged on a photo resist film formed on a first major surface of a semiconductor integrated circuit wafer and thus transferred.

7. The method of manufacturing a semiconductor integrated circuit according to claim 6, wherein the wavelength of said exposure light is at least 100 nm but less than 250 nm.

8. The method of manufacturing a semiconductor integrated circuit according to claim 7, wherein the wavelength of said exposure light is at least 100 nm but less than 200 nm.

9. The method of manufacturing a semiconductor integrated circuit device according to claim 8, wherein, in the peripheral portion of the first major surface of said mask substrate, a light screening metal region is provided.

10. The method of manufacturing a semiconductor integrated circuit device according to claim 9, wherein, on the first major surface of said mask substrate, a pellicle is provided so as to cover said integrated circuit pattern, said pellicle being contact-fixed on said light screening metal region.

11. A method of manufacturing a semiconductor integrated circuit device, comprising:
(a) the step of irradiating far ultraviolet or vacuum ultraviolet exposure light from a first major surface or second major surface side of a mask substrate, said mask substrate having, in an integrated circuit pattern region of the first major surface thereof, a light shielding pattern which is an integrated circuit pattern on a mask and comprises a phete-resist pattern including an organic film and having a light screening metal region provided in the peripheral region of said first major surface; and
(b) the step of reduction-projecting, by a projection optical system, said exposure light which has transmitted through said mask substrate, whereby, on a photo resist film formed on a first major surface of a semiconductor integrated circuit wafer, said integrated circuit pattern is imaged and thus transferred.

12. The method of manufacturing a semiconductor integrated circuit device according to claim 11, wherein the wavelength of said exposure light is at least 100 nm but less than 250 nm.

13. The method of manufacturing a semiconductor integrated circuit device according to claim 12, wherein the wavelength of said exposure light is at least 100 nm but less than 200 nm.

14. The method of manufacturing a semiconductor integrated circuit device according to claim 13, wherein, on the first major surface of said mask substrate, a pellicle is provided so as to cover said integrated circuit pattern, said pellicle being contact-fixed on said light screening metal region.

15. A method of manufacturing a semiconductor integrated circuit device, comprising:
(a) the step of irradiating far ultraviolet or vacuum ultraviolet exposure light from a first major surface or a second major surface side of a mask substrate, said mask substrate having, in an integrated circuit pattern region of the first major surface thereof, a light shielding pattern which is an integrated circuit pattern on a mask and comprises a resist pattern including an organic film, wherein a pellicle is contact-fixed in that part of the peripheral portion of said integrated circuit pattern region in which said resist pattern is not formed; and (b) the step of reduction-projecting, by a projection optical system, said exposure light which has transmitted through said mask substrate, whereby, on a photo resist film formed on a first major surface of a semiconductor integrated circuit wafer, said integrated circuit pattern is imaged and thus transferred.

16. The method of manufacturing a semiconductor integrated circuit device according to claim 15, wherein the wavelength of said exposure light is at least 100 nm but less than 250 nm.

17. The method of manufacturing a semiconductor integrated circuit device according to claim 16, wherein the wavelength of said exposure light is at least 100 nm but less than 200 nm.

18. The method of manufacturing a semiconductor integrated circuit device according to claim 17, wherein, in the peripheral portion of the first major surface of said mask substrate, a light screening metal region is provided.

19. The method of manufacturing a semiconductor integrated circuit device according to claim 18, wherein, on the first major surface of said mask substrate, said pellicle is contact-fixed on said light screening metal region.

20. A method of manufacturing a semiconductor integrated circuit device, comprising:
(a) the step of irradiating far ultraviolet or vacuum ultraviolet exposure light from a first major surface side or a second major surface side of a mask substrate, said mask substrate having, on the first major surface thereof, a halftone light shielding pattern comprising a resist pattern including an organic film which constitutes an integrated circuit pattern on a mask; and
(b) the step of reduction-projecting, by a projection optical system, said exposure light which has transmitted through said mask substrate, whereby, on a photo resist film formed on a first major surface of a semiconductor integrated circuit wafer, said integrated circuit pattern is imaged and thus transferred.

21. The method of manufacturing a semiconductor integrated circuit device according to claim 20, wherein the wavelength of said exposure light is at least 100 nm but less than 250 nm.

22. The method of manufacturing a semiconductor integrated circuit device according to claim 21, wherein the wavelength of said exposure light is at least 100 nm but less than 200 nm.

23. The method of manufacturing a semiconductor integrated circuit device according to claim 22, wherein, in the peripheral portion of the first major surface of said mask substrate, a light screening metal region is provided.

24. The method of manufacturing a semiconductor integrated circuit device according to claim 23, wherein, on the first major surface of said mask substrate, a pellicle is provided so as to cover said integrated circuit pattern, said pellicle being contact-fixed on said light screening region.

25. A method of manufacturing a semiconductor integrated circuit device, comprising:
(a) the step of irradiating far ultraviolet or vacuum ultraviolet exposure light from a first major surface side or a second major surface side of a mask substrate, which has, on the first major surface thereof, a light shielding pattern which is an integrated circuit pattern on a Lebenson type phase shift mask and comprises a resist pattern including an organic film; and
(b) the step of reduction-projecting, by a projection optical system, the exposure light which has transmitted through said mask substrate, whereby, on a first major surface of a semiconductor integrated circuit wafer, said integrated circuit pattern is imaged and thus transferred.

26. The method of manufacturing a semiconductor integrated circuit device according to claim 25, wherein the wavelength of said exposure light is at least 100 nm but less than 250 nm.

27. The method of manufacturing a semiconductor integrated circuit device according to claim 26, wherein the wavelength of said exposure light is at least 100 nm but less than 200 nm.

28. The method of manufacturing a semiconductor integrated circuit device according to claim 27, wherein, in the peripheral portion of said first major surface, a light screening metal region is provided.

29. The method of manufacturing a semiconductor integrated circuit device according to claim 28, wherein, on the first major surface of said mask substrate, a pellicle is provided so as to cover said integrated circuit pattern, said pellicle being contact-fixed on said light screening metal region.

30. A method of manufacturing a semiconductor integrated circuit device, comprising:
(a) the step of irradiating far ultraviolet or vacuum ultraviolet exposure light from a first major surface or a second major surface side of a mask substrate, said mask substrate having, in an integrated circuit pattern region of said first major surface thereof, a light shielding pattern which is an integrated circuit pattern on a mask and comprises a resist pattern including an organic film, wherein a pellicle is contact-fixed in the peripheral portion of said integrated circuit pattern of said first major surface so as to cover said integrated circuit pattern; and
(b) the step of reduction-projecting, by a projection optical system, said exposure light which has transmitted through said mask substrate, whereby, on a photo resist film formed on a first major surface of a semiconductor integrated circuit, said integrated circuit pattern is imaged and thus transferred.

31. The method of manufacturing a semiconductor integrated circuit device according to claim 30, wherein the wavelength of said exposure light is at least 100 nm but less than 250 nm.

32. The method of manufacturing a semiconductor integrated circuit device according to claim 31, wherein the wavelength of said exposure light is at least 100 nm but less than 200 nm.

33. The method of manufacturing a semiconductor integrated circuit device according to claim 32, wherein, in the peripheral portion of the first major surface of said mask substrate, a light screening metal region is provided.

34. The method of manufacturing a semiconductor integrated circuit device according to claim 33, wherein, on the first major surface of said mask substrate, a pellicle is provided so as to cover said integrated circuit pattern, said pellicle being contact-fixed on said light screening metal region.

35. A method of manufacturing a semiconductor integrated circuit device, comprising:
(a) the step of irradiating far ultraviolet or vacuum ultraviolet exposure light from a first major surface or a second major surface side of a mask substrate, said mask substrate having, in an integrated circuit pattern region of said first major surface thereof, a light shielding pattern which is an integrated circuit pattern on a mask and comprises a resist pattern including an organic film, wherein a protective film is formed on said resist pattern so as to cover said integrated circuit pattern region of said first major surface; and (b) the step of reduction-projecting, by a projection optical system, said exposure light which has transmitted through said mask substrate, whereby, on a photo resist film formed on a first major surface of a semiconductor integrated circuit wafer, said integrated circuit pattern is imaged and thus transferred.

36. The method of manufacturing a semiconductor integrated circuit device according to claim 35, wherein the wavelength of said exposure light is at least 100 nm but less than 250 nm.

37. The method of manufacturing a semiconductor integrated circuit device according to claim 36, wherein the wavelength of said exposure light is at least 100 nm but less than 200 nm.

38. The method of manufacturing a semiconductor integrated circuit device according to claim 1, wherein said organic film has a light screening characteristic to said exposure light and has a sensitivity to a light source of a lithography system used in forming said light shielding pattern.

* * * * *